(12) United States Patent
Hatada et al.

(10) Patent No.: US 6,811,953 B2
(45) Date of Patent: Nov. 2, 2004

(54) EXPOSURE APPARATUS, METHOD FOR MANUFACTURING THEROF, METHOD FOR EXPOSING AND METHOD FOR MANUFACTURING MICRODEVICE

(75) Inventors: Hitoshi Hatada, Kawasaki (JP); Masaki Kato, Yokohama (JP); Motoo Koyama, Tokyo (JP); Hiroshi Shirasu, Yokohama (JP); Masahiro Iguchi, Tokyo (JP)

(73) Assignee: Nikon Corporation, Tokyo (JP)

( * ) Notice: Subject to any disclaimer, the term of this patent is extended or adjusted under 35 U.S.C. 154(b) by 126 days.

(21) Appl. No.: 09/861,698

(22) Filed: May 22, 2001

(65) Prior Publication Data

US 2002/0005940 A1 Jan. 17, 2002

(30) Foreign Application Priority Data

May 22, 2000 (JP) ..................................... P2000-149189
May 26, 2000 (JP) ..................................... P2000-157038

(51) Int. Cl.$^7$ ............................................. G01B 11/00
(52) U.S. Cl. ...................... 430/311; 430/396; 430/394; 430/397; 355/55; 355/69; 355/53; 355/67
(58) Field of Search ................................ 430/311–397; 355/53–69

(56) References Cited

U.S. PATENT DOCUMENTS 5,617,211 A * 4/1997 Nara et al. .................. 356/401
5,625,436 A   4/1997 Yanagihara et al. .......... 355/53
5,729,331 A   3/1998 Tanaka et al. ................ 355/53
6,323,937 B1 * 11/2001 Sano ........................... 355/69
2002/0187406 A1 * 12/2002 Magome et al. ............... 430/5

FOREIGN PATENT DOCUMENTS

JP    7-183212    7/1995

* cited by examiner

*Primary Examiner*—John A. McPherson
*Assistant Examiner*—Deborah Chacko-Davis
(74) *Attorney, Agent, or Firm*—Oblon, Spivak, McClelland, Maier & Neustadt, P.C.

(57) ABSTRACT

The memory unit stores the correlation of the positional change in the image planes of the projection optical modules in the focusing direction and the light quantity change. The image plane position determination unit finds the positional change value of the image planes of the projection optical modules based on the correlation information that is stored in the memory unit and the information on changes in the amount of light that is emitted to the projection optical modules. The compensation value calculating unit calculates the compensation value corresponding to the change in the amount of curvature in the image planes of the projection optical modules. The compensating unit compensates the change value in conformity with the compensation value. The focus compensation optical system is driven based on the change value that is compensated.

23 Claims, 25 Drawing Sheets

EXPOSURE APPARATUS, METHOD FOR MANUFACTURING THEROF, METHOD FOR EXPOSING AND METHOD FOR MANUFACTURING MICRODEVICE

BACKGROUND OF THE INVENTION

1. Field of the Invention

The present invention relates to an exposure apparatus, a method for manufacturing thereof, an exposure method, and a method for manufacturing a microdevice. In particular, it is related to a multi-scanning projection exposure apparatus, a method for manufacturing thereof, method for exposing, and method for manufacturing a microdevice, which projection exposes the pattern of a mask onto a photosensitive substrate while moving the mask and the photosensitive substrate relative to a projection optical system that is comprised, for example, of a plurality of reflection/refraction projection optical modules.

2. Related Technical Background

In recent years, the use of liquid crystal display (LCD) panels have become predominant as display components of devices such as word processors, personal computers and televisions. LCD panels are fabricated by patterning transparent thin electrodes onto a substrate in a desired shape using a photolithographic technique. As the apparatus for this photolithographic step, a projection aligner is utilized to projection expose an original image pattern that is formed on a mask onto a photoresist layer on a substrate using a projection optical system.

Recently though, there is greater demand for the size of these LCD panels to be made larger, and in order to meet this demand, an increase in the size of the exposure region in this type of aligner is also desired. In order to increase the size of this exposure region, so-called multi-scanning projection aligners have been proposed. In the multi-scanning projection aligner, projection exposure of the pattern of a mask is performed while moving a mask and a substrate relative to a projection optical system that is comprised of a plurality of projection optical modules. It is noted here that the projection optical module may also be referred to as a projection optical unit. In the following, this is also included in the definition of a projection optical unit.

Also, in the multi-scanning projection aligner thus formed, the light that is supplied from the illumination optical system is incident to each projection optical module via a mask. The light that is incident to each projection optical module reaches the substrate after it passes through the lenses of each projection optical module. A portion of the light that is reflected on the surface of the substrate becomes return light and again passes through the lenses of each projection optical module.

In this manner, when the transmitted light from the mask and the reflected light from the substrate pass through the lenses of each projection optical module, a portion of the light is absorbed by the lenses. As a result, it may be considered that the optical characteristics of each projection optical module, for example the positioning of the image planes, thereof in a focusing direction, may change because of the heat deformation due to optical absorption of the lenses that form each projection module.

In this case, as described in detail below, the image plane of each projection optical module is not flat, but is actually curved due to curvature of field. And, the heat deformation of the lenses due to optical illumination causes not only the fluctuation in the image plane positioning for each projection optical module, but also changes in the curvature of field. Accordingly, even if, for example, the center or the mean positioning of the image plane of each projection optical module are controlled to be the same height, the portions that contribute to formation of the partially overlapping exposure region in the image planes of the projection optical modules that are next to each other are separated in a certain focusing direction, thus making it impossible to perform satisfactory overlapping exposures.

SUMMARY OF THE INVENTION

An object of the present invention is to provide an exposure apparatus, an exposure apparatus manufacturing method, and an exposure method capable of preventing changes in optical characteristics due to heat in projection optical modules caused by light.

Another object of the present invention is to provide an exposure apparatus, and manufacturing method thereof, capable of performing favorable overlapping exposure by setting at nearly the same position in the focusing direction the portions that contribute to the formation of partially overlapping regions in the image planes of projection optical modules that are next to each other, even if the position of the image planes of each projection optical module should change because of thermal deformation of the lenses, for example.

A further object of the present invention is to provide an exposure apparatus, and manufacturing method thereof, capable of performing favorable exposure, even if the optical characteristics of each projection optical module should change because of thermal deformation of the lenses, for example, by adjusting the changed optical characteristics and correcting other optical characteristics, which may be worsened due to the adjustment.

A further object of the present invention is to provide a method of fabricating a favorable large area microdevice (e.g., a semiconductor device, a LCD device, a thin-film magnetic head, etc.) by performing favorable exposure utilizing an exposure apparatus of the present invention.

A further object of the present invention is to provide an exposure apparatus and an exposure method, capable of substantially suppressing (controlling) the changes in the optical characteristics of each projection optical unit due to optical absorption in lenses.

According to an aspect of the present invention, an exposure apparatus, comprising an illumination optical system, which illuminates a mask with a predetermined pattern, a projection optical system, which includes a plurality of projection optical modules that are arrayed in a predetermined direction in order to form partially overlapping exposure regions on a photo sensitive substrate, and projects the pattern of the mask onto the photosensitive substrate, and a focusing adjustment unit, which aligns each respective image plane of the plurality of projection optical modules with respect to the photosensitive substrate in a certain focusing direction, wherein the focusing adjustment unit sets at a substantially same position in the certain focusing direction, certain portions that contribute to formation of the partially overlapping exposure regions on image planes of projection optical modules that are next to each other.

According to another aspect of the present invention, an exposure apparatus comprising, an illumination optical system, which illuminates a mask with a predetermined pattern, a projection optical system, which includes a plurality of projection optical modules that are arrayed in a predetermined direction, and projects the pattern of the mask onto a photosensitive substrate, a first adjusting unit, which compensates a change of a first optical characteristic in accordance with time passage with respect to at least one projection optical module of the plurality of projection optical modules, and a second adjusting unit, which compensates a second optical characteristic that differs from the first optical characteristic and is caused by to the first adjusting unit.

According to a further aspect of the present invention, an exposure apparatus comprising, an illumination optical system, which illuminates a mask with a predetermined pattern, a projection optical system, which includes a plurality of projection optical modules that are arrayed in a predetermined direction, and projects the pattern of the mask onto a photosensitive substrate, a first adjusting unit, which compensates a change of an optical characteristic with respect to at least one of the plurality of projection optical modules that develop due to heat deformation of at least one optical component that is included in each of respective the plurality of projection optical modules, a second adjusting unit, which compensates a change of an optical characteristic with respect to of the plurality of projection optical modules that develop due to heat deformation of at least one deflecting member included in each of respective the plurality of projection modules.

According to a further aspect of the present invention, an exposure apparatus, comprising, an illumination optical system, which illuminates a mask with a predetermined pattern, and a projection optical system, which comprises a plurality of projection optical modules that are irradiated with light from said illumination optical system through the mask and arrayed in a predetermined direction, and projects the pattern of the mask onto a photosensitive substrate, wherein, in order to form a partially overlapping exposure region onto the photosensitive substrate, image planes of the plurality of projection optical modules have a portion that contributes to the formation of the overlapping exposure regions; and moreover, in order to make position of portions that contribute to formation of the overlapping exposure regions that are next to each other substantially the same in certain focusing direction, further comprising a focus adjustment unit that performs adjustment of each position in the certain focusing direction of image planes of the plurality of projection optical modules.

According to a further aspect of the present invention, an exposure apparatus manufacturing method, which exposes a pattern of a mask onto a photosensitive substrate using a projection optical system having a plurality of projection optical modules arrayed in a predetermined direction in order to form partially overlapping exposure regions on the photosensitive substrate, and an illumination optical system that illuminates the mask with a predetermined pattern, the exposure apparatus manufacturing method comprising, a measurement step of measuring position of image planes of the plurality of projection optical modules in a certain focusing direction, and an adjustment step of adjusting so that portions that contribute to the partially overlapping exposure regions of image planes of projection optical modules that are next to each other have substantially the same position in the certain focusing direction using measurement information that is obtained in said measurement step.

According to a further aspect of the present invention, an exposure apparatus manufacturing method, which exposes a pattern of a mask onto a photosensitive substrate using a projection optical system that has a plurality of projection optical modules arrayed in a predetermined direction and an illumination optical system that illuminates the mask with a predetermined pattern, the exposure apparatus manufacturing method comprising, a calculation step of pre-calculating a maximum positional change amount for image planes of the plurality of projection optical modules in a certain focusing direction, and a setting step of setting initial reference image planes of the plurality of projection optical modules based on calculated results of the calculation step.

According to a further aspect of the present invention, an exposure apparatus, comprising, an illumination system for illuminating each of respective plurality of regions in a predetermined direction, the regions are included in a pattern formed on a mask, and a projection optical system, which comprises a plurality of projection optical units arrayed corresponding to the plurality of regions on a mask, and projects the pattern that is formed on the mask to a photosensitive substrate, wherein the illumination system forms a secondary light source at a position substantially optically conjugate with each respective pupil plane of the plurality of projection optical units, and has a function for introducing the light from the secondary light source into said mask, and the illumination system comprises, in order to actually control changes in each respective optical characteristic of the plurality of projection optical units by optical illumination, a setting unit that sets the secondary light source for an optical intensity distribution that is actually higher intensity in peripheral portion therein than in center portion therein.

According to a further aspect of the present invention, an exposure apparatus, comprising, an illumination system, which illuminates each of a plurality of regions positioned in a given direction on a mask with a pattern, and a projection optical system, which has a plurality of projection optical units positioned corresponding to the plurality of regions on the mask, and which projects the pattern formed on the mask onto a photosensitive substrate, wherein the illumination system has a function to form a secondary light source in a position substantially optically conjugate with the pupil plane of each of the plurality of projection optical units, and to guide light from the secondary light source to the mask, and the illumination system comprises a setting unit, which sets the outer diameter of the secondary light source when it is converted to a value on the pupil plane, to greater than 0.7 times the clear aperture of the pupil plane, so that a change in the optical characteristics of each of the plurality of projection optical units, which is caused by irradiation of light, can be controlled for the most part.

According to a further aspect of the present invention, an exposure apparatus, comprising, an illumination system, which illuminates a mask with a pattern, and a projection optical system, which projects the pattern on the mask onto a photosensitive substrate, wherein the illumination system comprises a formation unit, which forms a secondary light source in a position substantially conjugate with the pupil plane of the projection optical system, and an adjustment unit, which adjusts the optical intensity distribution of the secondary light source dependent upon a change in the optical characteristics of the projection optical system.

According to a further aspect of the present invention, an exposure apparatus, which exposes a photosensitive substrate through a mask on which a pattern to be transferred is formed on a plurality of regions in a given direction, the exposure apparatus comprising, a projection optical system, which has a plurality of projection optical units respectively positioned corresponding to the plurality of regions, and which projects the pattern onto a photosensitive substrate, and an illumination system, which forms a secondary light source in a position substantially optically conjugate with the pupil plane of each of the plurality of projection optical units, and which illuminates the mask with light from said secondary light source, wherein the illumination system includes a setting unit, which sets a optical intensity distribution where a peripheral portion of the secondary light source has a higher intensity than that of a center portion, so that change in the optical characteristics of each of the plurality of projection optical units, which is caused by light from the secondary light source, can be controlled.

According to a further aspect of the present invention, an exposure method, which illuminates a plurality of regions, which are positioned in a given direction on a mask with a pattern, and then projection exposes the pattern formed on the mask onto a photosensitive substrate through a projection optical system with a plurality of projection optical units positioned corresponding to the plurality of regions on the mask, the exposure method comprising, an illumination step of illuminating a plurality of regions on the mask by forming a secondary light source in a position nearly optically conjugate with the pupil plane of each of said plurality of projection optical units, and then guiding light from said secondary light source to the mask, and a setting step of setting the optical intensity distribution of the secondary light source where its peripheral portion has a practically higher intensity than that of its center portion, so that change in the optical characteristics of each of the plurality of projection optical units, which is caused by irradiation of light, can be practically controlled.

According to a further aspect of the present invention, an exposure method, which illuminates a plurality of regions, which are positioned in a given direction on a mask, on which a pattern to be transferred is formed, and then projection exposes the pattern formed on the mask onto a photosensitive substrate through a projection optical system with a plurality of projection optical units positioned corresponding to the plurality of regions on said mask, the exposure method comprising, an illumination step of illuminating a plurality of regions on the mask by forming a secondary light source in a position nearly optically conjugate with the pupil plane of each of the plurality of projection optical units, and then guiding light from said secondary light source to said mask, and a setting step of setting the outer diameter of the secondary light source when it is converted to a value on said pupil plane, to greater than 0.7 times the clear aperture of the pupil so that change in the optical characteristics of each of the plurality of projection optical units, which is caused by irradiation of light, can be practically controlled.

According to a further aspect of the present invention, an exposure method comprising, an illumination step of illuminating a mask using an illumination optical system, and a transcription step of transcribing a pattern that is formed on said mask onto a photosensitive substrate, wherein the illumination step includes a step of making an optical intensity distribution at pupil of the illumination optical system higher a peripheral portion than a center portion, and the transcription step comprising, a first exposure step, which forms a first exposure region on the photosensitive substrate while making the optical intensity distribution at pupil of said illumination optical system higher the peripheral portion than the center portion, and a second exposure step, which forms on the photosensitive substrate a second exposure region that partially overlaps the first exposure region while making the optical intensity distribution at pupil of the illumination optical system higher the peripheral portion than the center portion.

According to a further aspect of the present invention, a microdevice manufacturing method comprises an exposure step of exposing the pattern image of the mask onto the photosensitive substrate using the aforementioned exposure apparatus, and a development step of developing the substrate exposed.

According to a further aspect of the present invention, an exposure apparatus includes, an illumination system that illuminates each of a plurality of regions positioned in a given direction on a mask, on which a pattern to be transferred is formed, and a projection optical system that has a plurality of projection optical units positioned corresponding to the plurality of regions on the mask, and which projection exposes the pattern formed on the mask onto a photosensitive substrate through the projection optical system. This illumination system comprises at least one light source, a light guide, which has the same number of incident end(s) as that of the light sources and the same number of emitting end(s) as that of the plurality of projection optical units, at least one relay optical system, which guides light from the at least one light source to the incident end of the light guide, a plurality of optical integrators, which form a secondary light source in a position nearly optically conjugate with the pupil plane of each of the plurality of projection optical units dependent upon luminous flux emitted from a plurality of emitting ends of the light guide; a plurality of capacitor optical systems, which guide luminous flux from the plurality of secondary light sources to the plurality of regions of the mask, respectively; and a setting unit, which sets the optical intensity distribution of the plurality of secondary light sources to a optical intensity distribution with its peripheral portion having a substantially higher intensity than that of its center portion, so that change in the optical characteristics of each of the plurality of projection optical units, which is caused by irradiation of light, can be practically controlled.

According to a further aspect of the present invention, an exposure apparatus includes an illumination system that illuminates each of a plurality of regions positioned in a given direction on a mask, on which a pattern to be transferred is formed, and a projection optical system that has a plurality of projection optical units positioned corresponding to the plurality of regions on the mask, and which projection exposes the pattern formed on the mask onto a photosensitive substrate through the projection optical system. This illumination system comprises at least one light source, a light guide, which has the same number of incident end(s) as that of the light sources and the same number of emitting end(s) as that of the plurality of projection optical units, at least one relay optical system, which guides light from the at least one light source to the incident end of the light guide; a plurality of optical integrators, which form a secondary light source in a position nearly optically conjugate with the pupil plane of each of the plurality of projection optical units dependent upon luminous flux emitted from a plurality of emitting ends of the light guide, a plurality of capacitor optical systems, which guide luminous flux from the plurality of secondary light sources to the plurality of regions of the mask, respectively, and a setting unit, which sets the optical intensity distribution of the plurality of secondary light sources when it is converted to a value on the pupil plane, to greater than 0.7 times the clear aperture of the pupil plane, so that change in the optical characteristics of each of the plurality of projection optical units, which is caused by irradiation of light, can be practically controlled.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS (First Embodiment)

Figure 1:
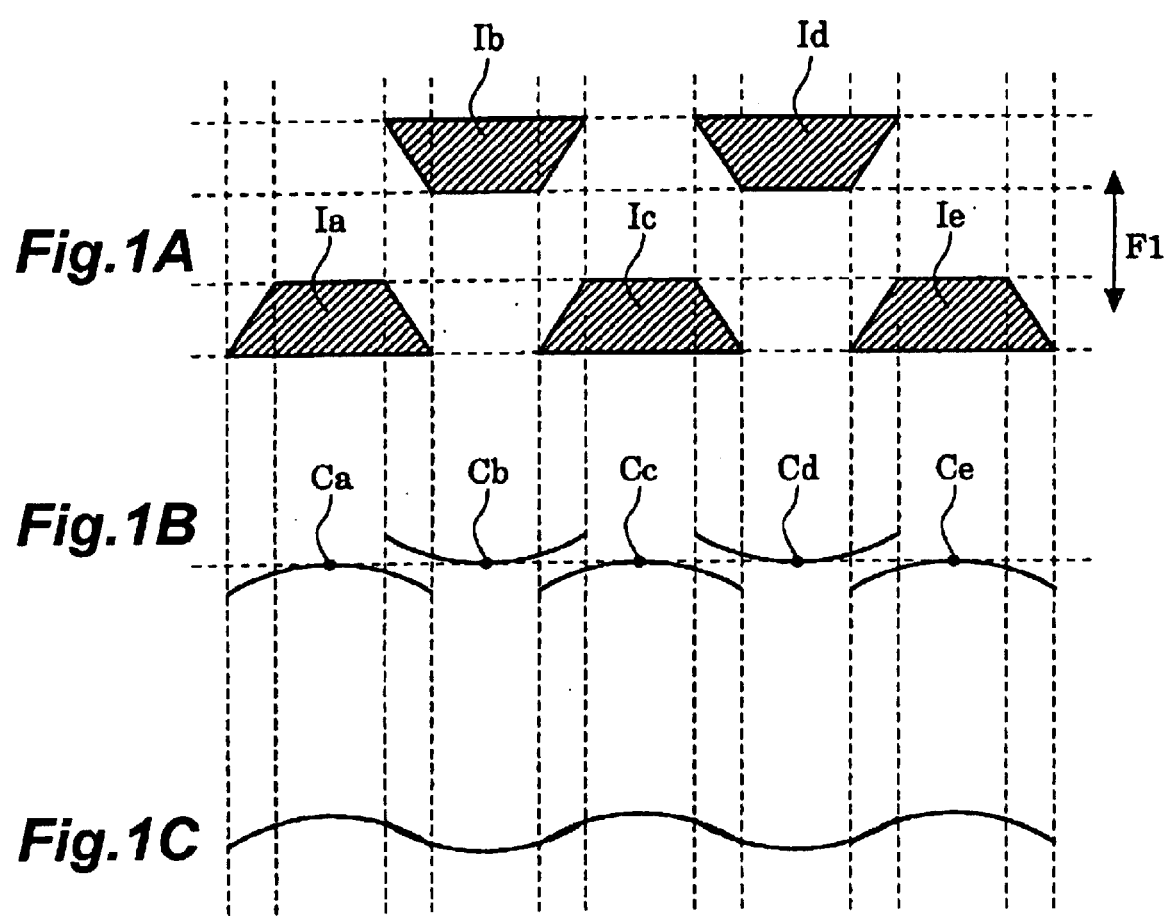
FIG. 1A is a top view of image planes of the corresponding projection optical modules that are provided in the exposure apparatus of the first embodiment of the present invention.
FIG. 1B is a diagram of the image planes of the corresponding projection optical modules that are provided in an exposure apparatus that is to become a comparative example, as seen from the scanning direction F1.
FIG. 1C is a diagram of the image planes of the corresponding projection optical modules of FIG. 1A, as seen from the scanning direction F1.

The basic inventive concepts of a multi-scanning projection exposure apparatus according to the first embodiment of the present invention are described using FIGS. 1A, 1B, and 1C. FIG. 1A is a top view of image planes of the corresponding projection optical modules that are provided in the exposure apparatus of the first embodiment of the present invention. FIG. 1B is a diagram of the image planes of the projection optical modules that are provided for an exposure apparatus that is to become a comparative example, as seen from the scanning direction F1. FIG. 1C is a diagram of the image planes of the projection optical modules of FIG. 1A, as seen from the scanning direction F1. It is noted here that focus compensating optical system Gf (see FIG. 4), lens control chamber LC (see FIG. 9), second right-angle prism PR2 (see FIG. 10) are examples of a focusing adjustment unit. The structure and operation thereof will be described later.

In the multi-scanning projection exposure apparatus according to the first embodiment, as shown in FIG. 1A, trapezoid-shaped image planes Ia to Ie of a plurality of projection optical modules (not shown in the Figure) are formed and placed in a staggered configuration in the direction that intersects the scanning direction illustrated by arrow F1 (hereafter referred to as the 'scanning-intersect direction'). The rectangular region of each image plane Ia to Ie does not contribute to the formation of the partly overlapped exposure region. The triangular portion at both ends of each image plane Ia to Ie is the portion that contributes to the formation of the partly overlapped exposure region.

Image planes Ia to Ie of each projection optical module are not actually flat, but curved due to the curvature of field. Also, heat deformation of lenses due to optical irradiation occurs and causes not only the position of image planes Ia to Ie of each projection optical module in a focusing direction to change, but also their curvature to change. Accordingly, as shown in FIG. 1B, even if center points Ca to Ce of each projection optical module image plane Ia to Ie are adjusted to be all the same height, the portions next to each other that contribute to the formation of the partly overlapped exposure region in the image planes of the projection optical modules are separated in a focusing direction, and favorable overlapping exposure may not be attained.

It is noted here that, although it is not shown in the Figures, even if the averaged image planes (may be referred to hereafter as 'best focus field), which are defined as being the average position in a focusing direction, are adjusted to have the same height, impropriety developed in the same manner as when their center points Ca to Ce were adjusted to be the same height. In other words, in this case as well, the portions that contribute to the formation of partially overlapping exposure areas in the image planes of the projection optical modules that are next to each other become separated in a focusing direction, thus making it impossible to perform favorable overlapping exposure.

Accordingly, with the first embodiment, as shown in FIG. 1C, in order to set the placement of the portions that contribute to forming the partially overlapping exposure areas in the image planes of the projection optical modules that are next to each other to be nearly the same in a focusing direction, the image planes of each projection optical module are brought into alignment in a focusing direction. As a result, even if heat deformation of lenses occurs to change the position of image planes Ia to Ie of each projection optical module, image planes Ia to Ie of each projection optical module are adjusted to become connected in the scanning-intersect direction, thus making it possible to perform satisfactory multiple exposures.

In the following, the first through third adjustment processes for the image plane positions of each projection optical module according to the first embodiment are described. In the first adjustment process, the change in the position of the best focus field (the average image plane or plane) of each respective image plane Ia to Ie of the projection optical modules due to optical absorption is measured. Here, for example, by measuring part of the light heading towards image planes Ia to Ie of each projection optical module, the change in the position of the best focus field of image planes Ia to Ie of each projection module may be measured. More specifically, the correlation between the light quantity change measured and the change in the position of the best focus field of each respective image plane Ia to Ie of the projection optical modules is stored beforehand and based on that memorized correlation and the light quantity change that is actually measured, the change in the position of the best focus field of each projection optical module may be determined.

However, as mentioned above, since image planes Ia to Ie of the projection optical modules are actually curved due to curvature of field, the amount of change in the position of the best focus field of each respective image plane Ia to Ie of the projection optical modules that are obtained from the measurements is compensated using the compensation value that correlates to the amount of curvature of field for each projection module. In such cases, in the first adjustment process, for example, the compensation value that has been determined by actually testing each of the projection optical modules is stored beforehand, and using each of those compensation values that have been stored, the amount of change in the position of the best focus field of each respective image plane Ia to Ie of the projection optical modules that are obtained from the measurements is compensated.

Accordingly, in the first adjustment process, the amount of curvature of field may vary (in other words, the compensation value may vary) for each projection optical module; however, the change due to optical absorption in the amount of curvature of field for each projection optical module has nearly no affect on its focal adjustment. As such, it is particularly effective in cases where there is virtually no need to consider the change in the amount of curvature of field of each projection optical module due to optical absorption.

On the other hand, in the second adjustment process, as with the first adjustment process, using the compensation value corresponding to curvature of field of each projection optical module, the amount of change in the position of the best focus field of each respective image plane Ia to Ie of the projection optical modules that are obtained from the measurement is compensated. However, in this second adjustment, unlike the first adjustment process, the compensation value corresponding to the change in the amount of curvature of field for each projection optical module is calculated based on, for example, the measurements of the calculation unit (in other words the light quantity change that has been measured), and using each of the compensation values that have been calculated, the amount of change in the position of the best focus field of each respective image planes Ia to Ie of the projection optical modules that are obtained from the measurements is compensated.

Accordingly, since curvature of field varies (in other words, the compensation value varies) for each projection optical module, and in addition, the changes due to optical absorption in the curvature of field of each projection optical module affect focal adjustment, the second adjustment process is particularly effective in cases where it is necessary to consider the actual changes due to optical absorption in the curvature of field of each projection optical module.

Moreover, in the third adjustment process, the correlation of the change in the position in a focusing direction of the portion that contributes to the partially overlapping exposure region of curved image planes Ia to Ie of the projection optical modules and the light quantity change that is measured is stored ahead of time, based on this correlation that has been stored and the amount of change in light that has actually been measured, the change in a focusing direction in the position of the portions that contribute to the formation of the partially overlapping region in image planes Ia to Ie of the projection optical modules may be obtained directly, and the position of the portions that contribute to the formation of the partially overlapping region in image planes Ia to Ie of the projection optical modules that are next to each other may be set to be almost the same.

It is noted here that in order to improve the accuracy of the focal adjustment, as mentioned above, the light quantity change for each projection optical module is measured, and focal adjustment is performed for each projection optical module, preferably independently. Furthermore, in order to reduce the effect on the mask pattern structure (i.e., the density of the pattern or the transmittance of the pattern in each illuminated region of the mask), the amount of change in light is measured for each projection optical module, and focal adjustment is performed for each optical module, preferably independently. However, whether the process of focal adjustment of each projection optical module is performed independently or together at one time, there is no deviation from the scope of the present invention.

In this manner, according to an aspect of the first embodiment, for example, even if the position of the image planes of the projection optical modules changes due to heat deformation of the lenses, the portions that contribute to the partially overlapping exposure region in the image planes of the optical projection modules that are next to each other are set at almost the same position in a focusing direction; thereby making it possible to perform favorable overlapping exposure.

Furthermore, according to another aspect of the first embodiment, even if the optical characteristics of each projection optical module should change because of, for example, heat deformation of the lenses, it is possible to provide an exposure apparatus that is capable of adjusting the optical characteristics that have changed together with compensating other optical characteristics that have deteriorated due to this adjustment, and thus perform favorable exposure.

Furthermore, it is possible to manufacture high quality, large screen microdevices, for example highly accurate LCD devices, through the favorable exposure obtained by using the exposure device that is configured according to the first embodiment.

In the following, the first embodiment of the present invention is described while referencing the attached Figures.

Figure 2:
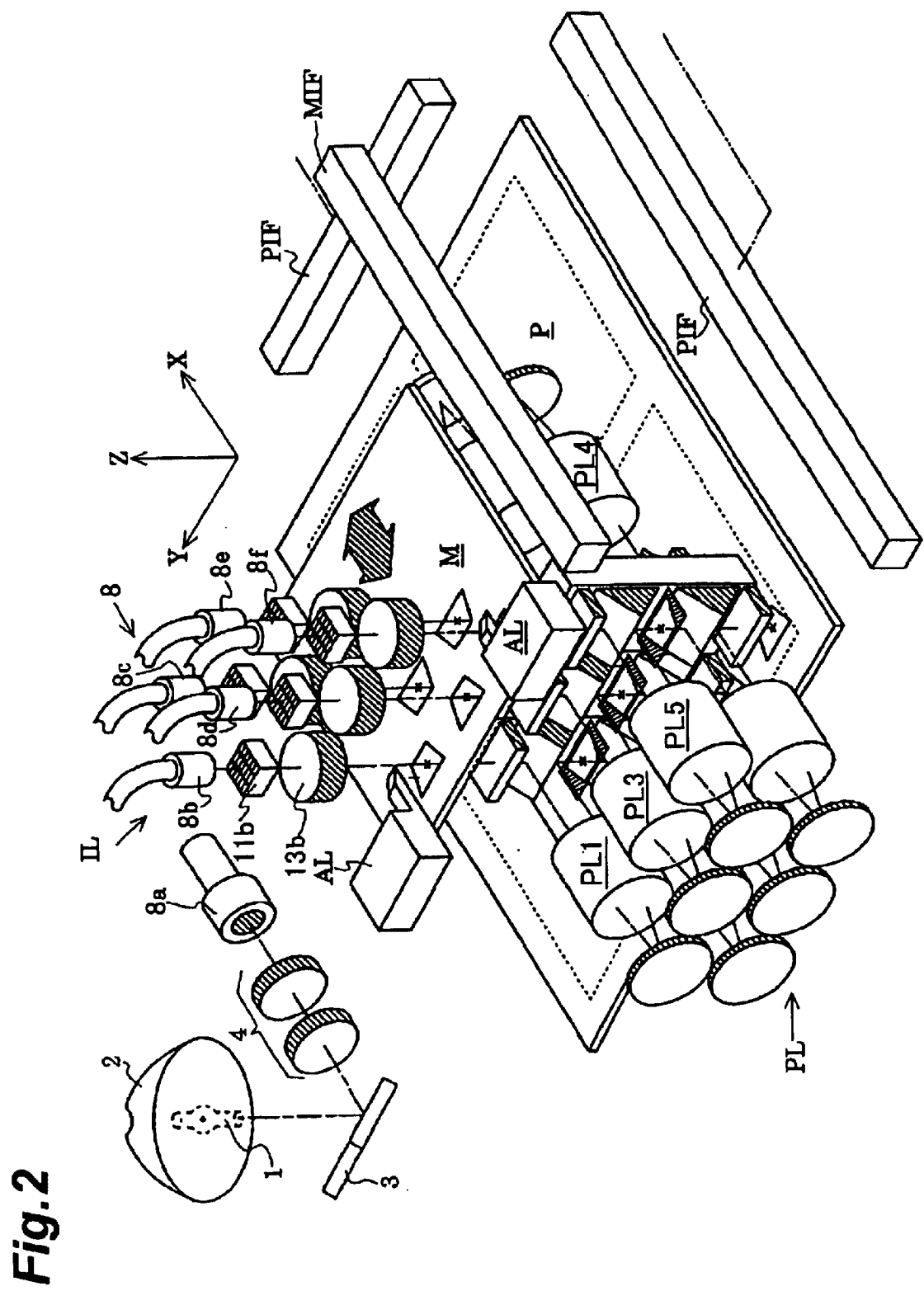
FIG. 2 is a perspective view for schematically illustrating the overall structure of the exposure apparatus of the first embodiment.
Figure 3:
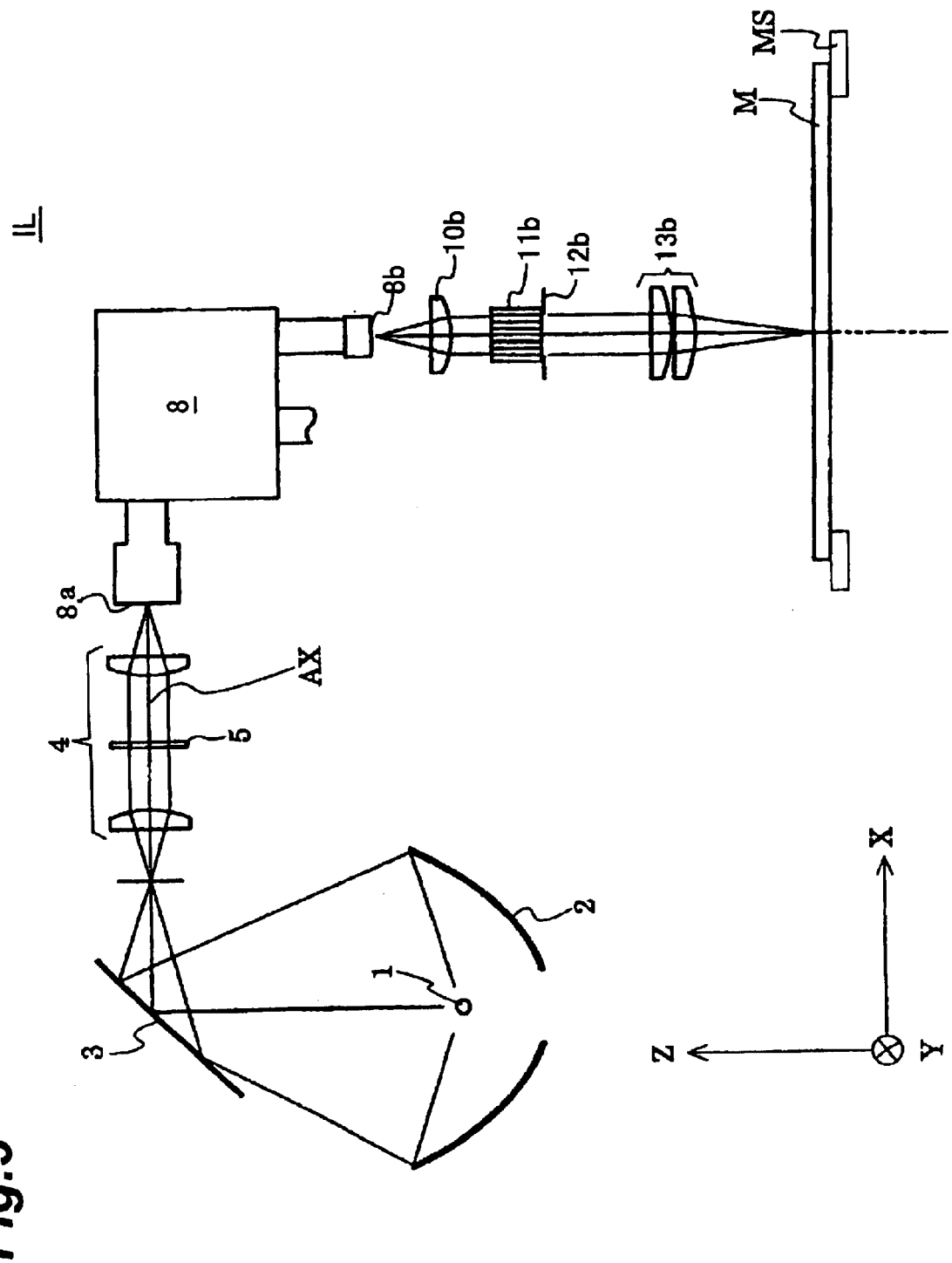
FIG. 3 is a diagram for schematically illustrating the structure of the illumination system in the exposure apparatus of the first embodiment.
Figure 4:
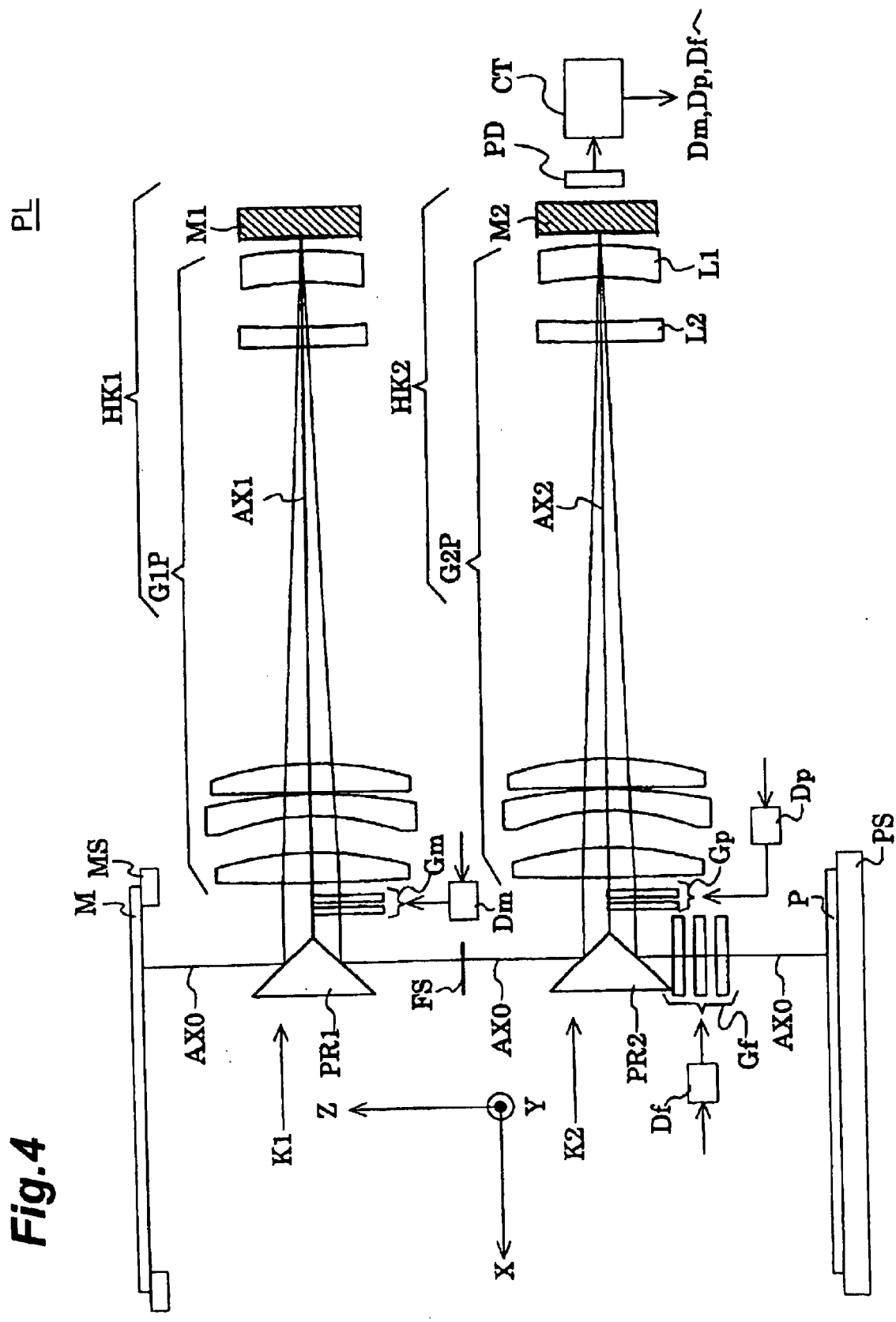
FIG. 4 is a diagram for schematically illustrating the structure of each projection optical module that forms the projection optical system in the exposure apparatus of the first embodiment.

FIG. 2 is a perspective view for schematically illustrating the overall structure of an exposure device according to the first embodiment. In addition, FIG. 3 is a diagram for schematically illustrating the structure of the illumination system in the exposure apparatus of FIG. 2, and FIG. 4 is a diagram for schematically illustrating the structure of each projection optical module that forms the projection optical system in the exposure apparatus of FIG. 2.

In the first embodiment, the present invention is made suitable for a multi-scanning projection aligner that performing projection exposure of a mask pattern onto a substrate while moving the mask and the substrate relative to a projection optical system comprising a plurality of reflection/refraction projection optical modules. The projection optical module may also be referred to as a projection optical unit. The following projection optical module is also defined as such. It is noted here that in the FIG. 2 to FIG. 4, the X-axis is set as the direction (the scanning direction) in which is moved a mask which a desired circuit pattern is formed and a substrate that is coated a resist. In addition, the Y-axis is set to be the direction that intersects the X-axis in the plane of the mask, and the Z-axis is the direction normal to the substrate.

The exposure device of the first embodiment is comprised of illumination system IL, which is used for evenly illuminating mask M that is supported parallel to the XY plane by the mask holder (not shown in the Figures) on top of mask stage MS (not shown in FIG. 2). Referring to FIGS. 2 and 3, illuminating system IL includes light source 1 comprising, for example, an extra-high pressure mercury vapor lamp. Light source 1 is positioned at the first focal point of elliptical mirror 2, which has a reflective surface comprising an ellipsoidal surface of revolution. Accordingly, the illuminant flux emitted from light source 1 forms the light source image at the second focal point of elliptical mirror 2 via reflecting mirror (planar mirror) 3. A shutter (not shown in the Figures) is placed at this second focal point.

The divergent luminous flux from the light source image that is formed at the second focal point of elliptical mirror 2 is again formed into an image via relay lens system 4. Selective wavelength filter 5 (not shown in FIG. 2), which only allows luminous flux having wavelength within desired range to pass through it, is placed near the pupil plane of relay lens system 4. With selective wavelength filter 5, g-ray (436 nm) light, and h-ray (405 nm) and i-ray (365 nm) light are simultaneously selected as exposure light. It is noted here that with selective wavelength filter 5, for example both g-ray light and h-ray light may be selected at the same time, h-ray light and i-ray light may be selected at the same time, or only i-ray light may be selected.

Incident end 8a of light guide 8 is placed near the position of where the light source image is formed by relay lens system 4. Light guide 8 is a random light guide fiber, which is comprised of a plurality of randomly bundled strands of fiber. It is comprised of the same number of incident ends 8a as the number of light sources 1 (in FIG. 2 there is one), and the same number of emitting ends 8b to 8f (in FIG. 3, only emitting end 8b is shown) as the number of projection optical modules that configure projection optical system PL (in FIG. 2 there are five). In this manner, the light that is incident to incident end 8a of light guide 8 is emitted from the five emitting ends 8b to 8f after propagating through the inside of it.

The divergent luminous flux that is emitted from emitting end 8b of light guide 8, after being transformed into a nearly parallel luminous flux by collimate lens 1 (not shown in FIG. 2), are incident to fly-eye integrator (optical integrator) 11b. Fly-eye integrator 11b is structured by having a plurality of positive lens components densely arrayed lengthwise and crosswise extending with those center axis being along optical axis AX, as the center axis. Consequently, the luminous flux incident to fly-eye integrator 11b are subjected to wavefront splitting by the plurality of lens components, and a secondary light source, which is comprised of the same number of the light source images as the number of the lens components, is formed at the rear focal plane (in other words, near the emitting end). Namely, at the rear focal plane of fly-eye integrator 11b, a substantially planar light source is formed. It is noted here that the optical integrators (11b to 11f) are not limited to being a fly-eye integrator, but may even be a diffractive optics, a micro fly-eye lens fabricated from an aggregate of minute lens components, or may have a structure that includes a rod-shaped internal reflection integrator (such as a hollow pipe, an optical pipe or pole-shaped glass rod). This also holds for the example mentioned below.

After the luminous flux from the secondary light source is limited by the aperture stop 12b (not shown in FIG. 2) that is configured near the rear focal plane, it is incident to the condenser lens system 13b. It is noted here that aperture stop 12b is placed at a some what optically conjunctive position with the pupil plane of the corresponding projection optical module PL1, and has a changeable aperture portion, which is used to control the field of the secondary light source that contributes to illumination. Aperture stop 12b is used to change the size of the aperture of this changeable aperture portion, so that a σ value (ratio of the diameter of the secondary light source image on the pupil plane to the diameter of the aperture of the pupil plane of each projection optical module PL to PL5 that form the projection optical system), which determines the illumination conditions, is set to a desired value.

The luminous flux that passes through condenser lens system 13b illuminates in an overlapping manner mask M, on which is formed the predetermined transfer pattern. In the same manner, the divergent luminous flux that is emitted from the other emitting ends 8c to 8f of light guide 8 also pass through respective collimate lenses 10c to 10f, fly-eye integrators 11c to 11f, aperture stops 12c to 12f, and condenser lenses 13c to 13f to illuminate mask M in an overlapping manner. In other words, illumination system IL illuminates the plurality of trapezoid-shaped regions lined up in the Y-direction on mask M.

It is noted here that in the example mentioned above, the illuminated light in illumination system IL from optical source 1 is evenly split into five portions of illuminated light via light guide 8; however, neither the number of light sources nor the number of projection optical modules is limited, but may include any number of variations. Namely, two or more light sources may be provided, depending on needs, and the illuminated light from these two or more light sources may be evenly split into the required number of portions of illuminated light (the number of projection optical modules) via an appropriate random light guide. In this case, the light guide has the same number of incident ends as the number of light sources, and the same number of emitting ends as the number of projection optical modules.

The light from each illuminated region on mask M is incident to projection optical system PL, which comprises a plurality of (in FIG. 2 a total of five) optical projection modules PL1 to PL5 that are configured in the Y-direction corresponding to each illuminated region. At this point, the respective structures of each projection optical module PL1 to PL5 are the same as each other. In the following, the structure of each projection optical module is described while referencing FIG. 4.

The projection optical module shown in FIG. 4 comprises first imaging optical system K1, which forms a primary image of the mask pattern based on the light from mask M, and second imaging optical system K2, which forms a real-size erect image (secondary image) onto substrate P based on the light from this primary image. It is noted here that field stop FS, which defines the field region (illumination region) of the projection module on mask M and the projection region (exposure region) of the projection optical module on substrate P, is configured near the position where the primary image of the mask pattern is formed.

First imaging optical system K1 comprises first right-angle prism PR1, which has a first reflective face that is set at a 45° angle slant to the mask plane (the XY plane) so as to reflect in the X-direction the light that is incident in the −Z-direction from mask M. First imaging optical system K1 additionally comprises, in order from the first right-angle prism PR1 side, first refractive optical system G1P, which has positive refractivity, and first concave reflecting mirror M1, which has its concave surface facing first right-angle prism PR1. First refractive optical system G1P and first concave reflecting mirror M1 are configured in the −X-direction and together form first reflective/refractive optical system HK1. The light that is incident from first reflective/refractive optical system HK1 to first right-angle prism PR1 in the +X-direction is reflected in the −Z-direction by a second reflective face that is set at a 45° angle slant to the mask plane (XY plane).

On the other hand, second imaging optical system K2 comprises second right-angle prism PR2, which has a first reflective face that is set at a 45° angle slant to the substrate plane (XY plane) so as to reflect in the −X-direction light that is incident in the −Z-direction from the second reflective face of first right-angle prism PR1. Second imaging optical system K2 initially comprises, in order from the second right-angle prism PR2 side, second refractive optical system G2P, which has positive refractivity, and second concave reflecting mirror M2, which has its concave surface facing the second right-angle prism PR2 side. Second refractive optical system G2P and second concave reflecting mirror M2 are placed in the X-direction and together form second reflective/refractive optical system HK2. The light that is incident to second right-angle prism PR2 from second reflective/refractive optical system HK2 in the +X-direction is reflected in the −Z-direction by second reflective face, which is set at a 45° angle slant to the substrate plane (XY substrate plane)

It is noted here that in the first embodiment, mask side magnification compensating optical system Gm is attached in the optical path between first reflective/refractive optical system HK1 and the second reflective face of first right-angle prism PR1, and substrate side magnification compensating optical system Gp is attached in the optical path between second reflective/refractive optical system HK2 and the second reflective face of second right-angle prism PR2. In addition, focus compensation optical system Gf is attached in the optical path between the second reflective face of second right-angle prism PR2 and the substrate P. Moreover, photodetector PD, which is used to detect illuminated light (exposure light) that passes through second concave reflecting mirror M2, is configured on the posterior side of second concave reflecting mirror M2. Photodetector PD may also be placed on the posterior side of first concave reflecting mirror M1.

Figure 5:
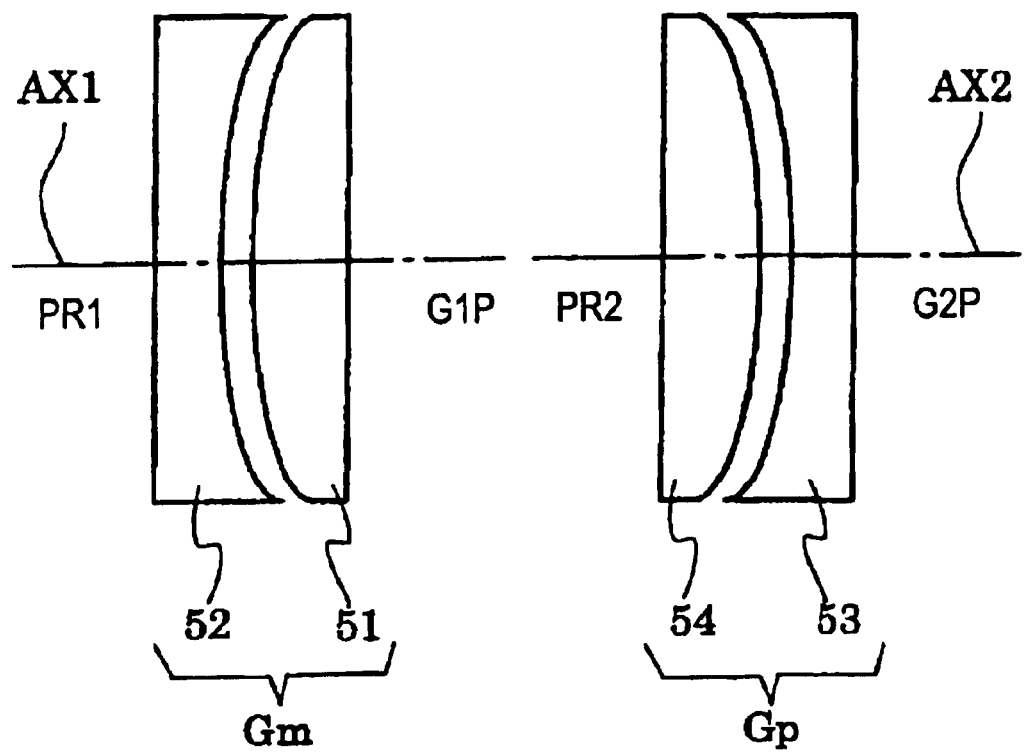
FIG. 5 is a diagram for schematically illustrating the structure of a mask-side magnification compensating optical system Gm and a substrate-side magnification compensating optical system Gp of the first embodiment.
Figure 6:
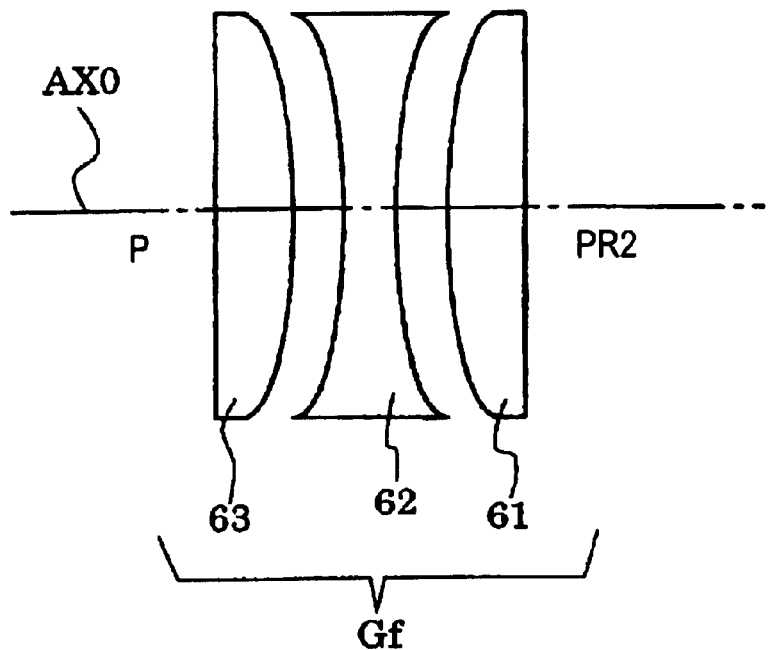
FIG. 6 is a diagram for schematically illustrating the structure of a focus compensating optical system Gf of the first embodiment.

FIG. 5 is a diagram for schematically illustrating the structure of mask side magnification compensating optical system Gm and substrate side magnification compensating optical system GP of FIG. 4. FIG. 6 is a diagram for schematically illustrating the structure of focus compensation optical system Gf of FIG. 4. In the following, the structure and function of mask side magnification compensating optical system Gm, substrate side magnification compensating optical system Gp and focus compensation optical system Gf are explained.

Referencing FIG. 4, the optical axis of first reflective/refractive optical system HK1 is shown as AX1, and the optical axis of second reflective/refractive optical system HK2 is shown as AX2. In addition, the path of the beam of light that progresses in the −Z-direction from the center of the illumination region on mask M, which is defined by field stop FS, passes through the center of field stop FS, and then reaches the center of the exposure region on substrate P that is controlled by the same field stop FS is shown as field center axis AX0.

Mask side magnification compensating optical system Gm, which is in the optical path between first refractive optical system G1p and the second reflective face of first right-angle prism PR1, and is comprised of, in order from first refractive optical system G1P along axis AX0, planoconvex lens 51, the flat side of which facing the first refractive optical system G1P side, and planoconcave lens 52, the flat side of which facing the second reflective side of first right-angle prism PR1. In other words, the optical axis of mask side magnification compensating optical system Gm and axis AX0 match, and the convex surface of planoconvex lens 51 and the concave surface of planoconcave lens 52 have respective curvatures that are almost the same size and are facing each other with a certain interval between them.

Furthermore, substrate side magnification compensating optical system Gp, which is in the optical path between second refractive optical system G2P and the second reflective face of second right-angle prism PR2, is comprised of, in order from second refractive optical system G2P along axis AX0, planoconcave lens 53, the flat side of which facing the second refractive optical system G2P side, and planoconvex lens 54, the flat side of which facing the second reflective side of second right-angle prism PR2. In other words, the optical axis of substrate side magnification compensating optical system Gp also matches axis AX0, and the concave surface of planoconcave lens 53 and the convex surface of planoconvex lens 54 have respective curvatures that are almost the same size and are facing each other with a certain interval between them.

In more detail, by changing only the direction that mask side magnification compensating optical system Gm and substrate side magnification compensating optical system Gp face along axis AX0, they have the same structure as each other. Also, if at least one of the spaces between planoconvex lens 51 and planoconcave lens 52, which form mask side magnification compensating optical system Gm, and between planoconcave lens 53 and planoconvex lens 54, which form substrate side magnification compensating optical system Gp, should be changed even the slightest amount, not only would the projection magnification of the projection optical module change only a minute amount, but the position of its image plane in a focusing direction (along axis AX0) would also change only a minute amount. It is noted here that mask side magnification compensating optical system Gm is driven by first drive component Dm, and substrate side magnification compensating optical system Gp is driven by second drive component Dp.

On the other hand, focus compensation optical system Gf, which is in the optical path between the second reflective face of second right-angle prism PR2 and substrate P, is comprised of, in order from the second reflective face of second right-angle prism PR2 along axis AX0, planoconvex lens 61, the flat side of which facing the second reflective side of second right-angle prism PR2, biconcave lens 62, and planoconvex lens 63, the flat side of which facing the substrate P side. In other words, the optical axis of focus compensation optical system Gf matches axis AX0, and the convex portion of planoconvex lens 61, the concave portions of biconcave lens 62, and the convex portion of planoconvex lens 63 all have respective curvatures that are almost the same size and are facing each other with a certain interval between each of them.

If at least one of the spaces between planoconvex lens 61 and biconcave lens 62, or between biconcave lens 62 and planoconvex lens 63, which all form focus compensation optical system Gf, should change even the slightest amount, not only would the position of the image plane of projection optical module change only a very small amount in a focusing direction, but the projection magnification would also only change a very small amount. Focus compensation optical system Gf is configured so that it is driven by third drive component Df. In the following, in order to allow brevity in the description of the basic structure of each projection optical module, the situation where mask side magnification compensating optical system Gm, substrate side magnifying optical system Gp, and focus compensation optical system Gf are not configured is first described.

As described above, the pattern that is formed onto mask M is illuminated with almost even illuminance by the illuminating light (exposure light) from illumination system IL. The light that progresses in the −Z direction from the mask pattern that has been formed onto each illumination region of mask M, after it is deflected just 90° by first reflective face of first right-angle prism PR1, is incident to first reflective/refractive optical system HK1 in the −X-direction.

The light that is incident to first reflective/refractive optical system HK1 passes through first refractive optical system G1P to reach first concave reflecting mirror M1. Then the light that is reflected off first concave reflecting mirror M1 again passes through first refractive optical system G1P and is incident on the second reflective face of right-angle prism PR1 in the +X-direction. The light that is deflected just 90° by second reflective face of first right-angle prism PR1 so as to progress in the −Z-direction, forms a primary image of the mask pattern near the field stop FS. It is noted here that the lateral magnification in the X-direction of the primary image is +1 and the lateral magnification in the Y-direction of the primary image is −1.

The light that progresses in the −Z-direction from the primary image of the mask pattern is incident on second reflective/refractive optical system HK2 in the −X-direction after being deflected only 90° off the first reflective face of second right-angle prism PR2. Then the light that is incident on second reflective/refractive optical system HK2, passes through second refractive optical system G2P, and reaches second concave reflecting mirror M2. At this point, a portion of the incident light passes through second concave reflecting mirror M2 and is detected by photodetector PD, which is placed on the posterior thereof. The output of photodetectors PD1 to PD5 of projection optical modules PL1 to PL5, respectively, are each supplied to a single controller CT, which is common to each projection optical module PL1 to PL5. Controller CT performs drive control of mask side magnification compensating optical system Gm using first drive component Dm, performs drive control of substrate side magnification compensating optical system Gp using second drive component Dp, and performs drive control of focus compensation optical system Gf through third drive component Df.

The light that is reflected from second concave reflecting mirror M2 again passes through second refractive optical system G2P and is incident on the second reflective face of second right-angle prism PR2 in the +X-direction. Then the light that is deflected only 90° off the second reflective face of second right-angle prism PR2 so as to progress in the −Z-direction forms a secondary image of the mask pattern onto the corresponding exposure region of substrate P. Here both the lateral magnification in the X-direction and the lateral magnification in the Y-direction of the secondary image is +1. In other words, the mask pattern image that is formed onto substrate P through each projection optical module is a life-size erect image, and each projection optical module forms a life-size erecting system.

It is noted here that a portion of the light that is reflected off substrate P passes through second refractive optical system G2P and second concave reflecting mirror M2, and is detected by photodetector PD. In addition, with the above-mentioned first reflective/refractive optical system HK1, since first concave reflecting mirror M1 is placed near the rear focal-point position of first refractive optical system G1P, the mask M side and the field stop FS side become somewhat telecentric. In addition, since second concave reflecting mirror M2 is placed near the rear focal-point position of second refractive optical system G2P in second reflective/refractive optical system HK2 as well, both the field stop FS side and the substrate P side become somewhat telecentric. As a result, each projection optical module becomes somewhat telecentric on both sides (the mask M side and the substrate P side).

In this manner, the light that passes through projection optical system PL, which is formed by a plurality of projection optical modules PL1 to PL5, is formed into the mask pattern image on substrate P, which is supported parallel to the XY plane by a substrate holder on substrate stage (not shown in FIG. 2) PS. More specifically, as described above, since each projection optical module PL1 to PL5 is configured as a erect image forming system with a unit magnification, the erect image of the mask pattern is formed on the plurality of trapezoidal exposure regions lined up in the Y-direction to correspond to each illuminated region on substrate P, which is a photosensitive substrate under a unit magnification. Here, in the present invention, the erect image refers to an image with position horizontal and vertical lateral magnification.

Also, in mask stage MS a long stroke scanning drive system (not shown in the Figures) is provided, which is able to move in the scanning direction, namely the X-direction of this stage. In addition, a pair of alignment drive systems (not shown in the Figures) is configured in order to move mask stage MS only slightly in the Y-direction, which is the scanning-intersect direction, and at the same time rotate it only slightly about the Z-axis. It is also configured so that the position coordinates of mask stage MS are then measured by a laser interferometer MIF that uses a movable mirror, and the position thereof controlled.

The same manner of drive system is also configured for substrate stage PS. Specifically, a long stroke scanning drive system (not shown in Figures) that is used for moving substrate stage PS in the X-direction, which is the scanning direction, and a pair of alignment drive systems that are used to move substrate stage PS very slightly in the Y-direction, which is the scanning-intersect direction, and at the same time rotate it very slightly about the Z-axis. It is also configured so that the position coordinates of substrate stage PS are then measured by laser interferometer PIF, and the position thereof controlled.

Moreover, a pair of alignment systems AL is configured above mask M as unit for aligning mask M and substrate P relative to each other along the XY plane. An alignment system that finds the relative positions of a mask alignment mark, which is formed on, for example, mask M, and a substrate alignment mark that is formed on substrate P through image processing may be used as alignment system AL.

By operating the scanning drive system of the mask stage MS side and the scanning drive system of the substrate stage PS side, through the moving of mask M and substrate P in the same direction as one unit, relative to projection optical system PL, which comprises a plurality of projection optical modules PL1 to PL5, the entire pattern region of mask M may be transcribed (scanning exposed) onto the entire exposure region of substrate P. It is noted here that the description of the shape and the placement of the plurality of trapezoidal exposure regions, and by extension, the shape and placement of the plurality of trapezoidal illumination regions, is disclosed in detail in such patent gazettes as Japanese Application Laid-open No. Hei 7-183212 and duplicate descriptions are omitted.

Figure 7:
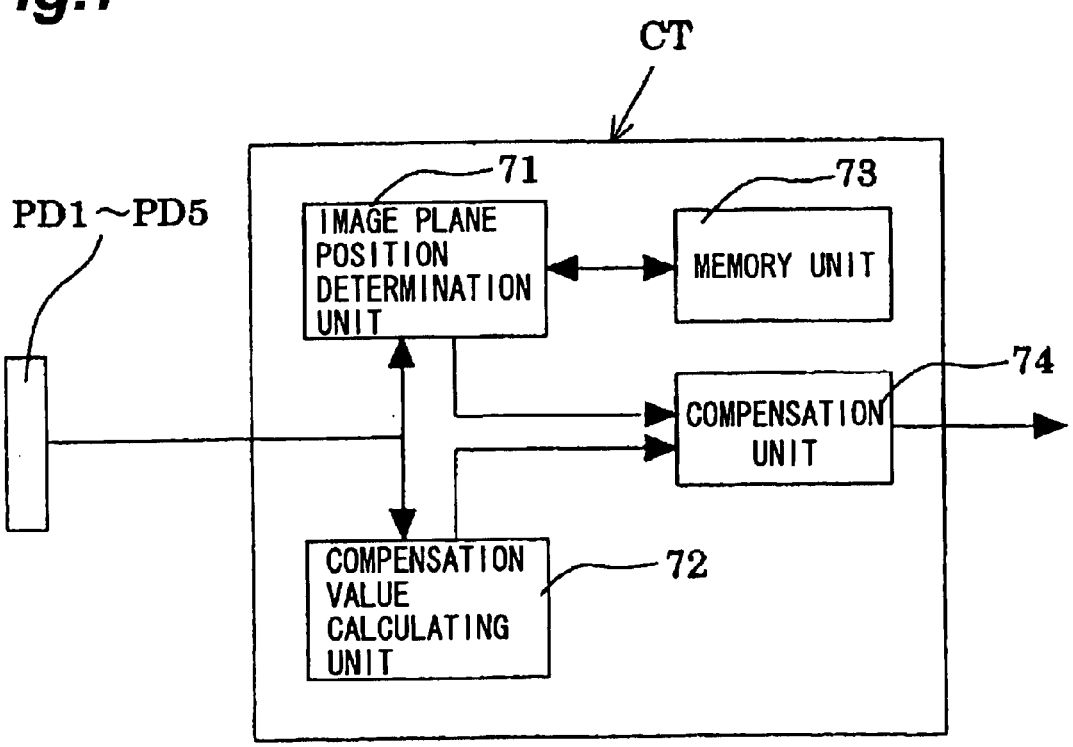
FIG. 7 is a diagram for schematically illustrating the inner structure of an example of a controller CT that is provided in the first embodiment.

FIG. 7 is a diagram for schematically illustrating the internal structure of controller CT of FIG. 4. Controller CT is an example of computation unit for finding the compensation value corresponding to each respective amount of curvature of field of each projection optical modules PL1 to PL5 based on the measurement data from photodetectors PD1 to PD5. In the following, the focus adjustment method (the adjustment of the positioning of the image plane in a focusing direction) in this embodiment is described. With this embodiment, as described above, photodetectors PD1 to PD5, which are configured in each projection optical module PL1 to PL5, measure the respective changes in the amount of light over time that is irradiated to each projection optical modules PL1 to PL5. The change in light quantity information that is respectively measured by photodetectors PD1 to PD5 is supplied to image plane position determination unit 71 of controller CT and compensation value calculating unit 72.

In addition, there is a configured memory unit 73, which stores the correlation between the change in the position in a focusing direction of image planes Ia to Ie (for example, the position of the best focus field in a focusing direction) of projection optical modules PL1 to PL5, and the light quantity change that is measured by each photodetector PD1 to PD5. In this manner, with image plane position determination unit 71, based on the change in light quantity information that is measured by photodetectors PD1 to PD5 and the correlating information that is stored in memory unit 73, the positional change value of image planes Ia to Ie of each projection optical module PL1 to PL5 may be found. The image plane positional change information is supplied to compensating unit 74.

On the other hand, with compensation value calculating unit 72, each compensation value may be calculated corresponding to the change in the amount of curvature of field of image planes Ia to Ie of each projection optical module PL1 to PL5 based on the change in light quantity information that is measured by photodetectors PD1 to PD5. Here each compensation value is the compensation value that is computed based on, for example, testing data of each projection optical module PL1 to PL5. Each compensation value that is calculated is supplied to compensating unit 74. With compensating unit 74, each of the respective positional change values of image planes Ia to Ie of each projection optical module PL1 to PL5 that are supplied from image plane position determination unit 71 is compensated based on the compensation value of each projection optical module PL1 to PL5 that is supplied from compensation value calculating unit 72. Controller CT supplies the control commands to third drive component Df of each projection optical module PL1 to PL5 based on the positional change values that are compensated in the position of image planes Ia to Ie of each projection optical module PL1 to PL5.

In this manner, focus compensation optical system Gf is driven through third drive unit Df in each projection optical module PL1 to PL5. As a result, even if the position of image planes Ia to Ie of the projection optical modules PL1 to PL5, or the curvature of field thereof, should change because of the heat deformation of a lens due to optical illumination, image planes Ia to Ie of the projection optical module PL1 to PL5 may be controlled so as to become somewhat connected in the scanning-intersect direction shown as FIG. 1C. In other words, the portions that contribute to the formation of the partially overlapping exposure region in the image planes of the projection optical modules that are next to each other may be set to be nearly the same position in a focusing direction.

However, as described above, if the distance between the lenses of focus compensation optical system Gf should change even an extremely small amount, the projection magnification will also only change an extremely small amount. In other words, in each projection optical module PL1 to PL5, depending on the focal adjustment by the focus compensation optical system Gf, there are cases where the focusing adjustment may deteriorate the projection magnification, which is one of other optical characteristics, to the point where they must be compensated. In these cases, with each projection optical module PL1 to PL5, changing the distance between lenses of at least either one of mask side magnification compensating optical system Gm or substrate side magnification compensating optical system Gp by an extremely small amount allows for correction of the changes in projection magnification that are worsened by focal adjustment.

Figure 8A:
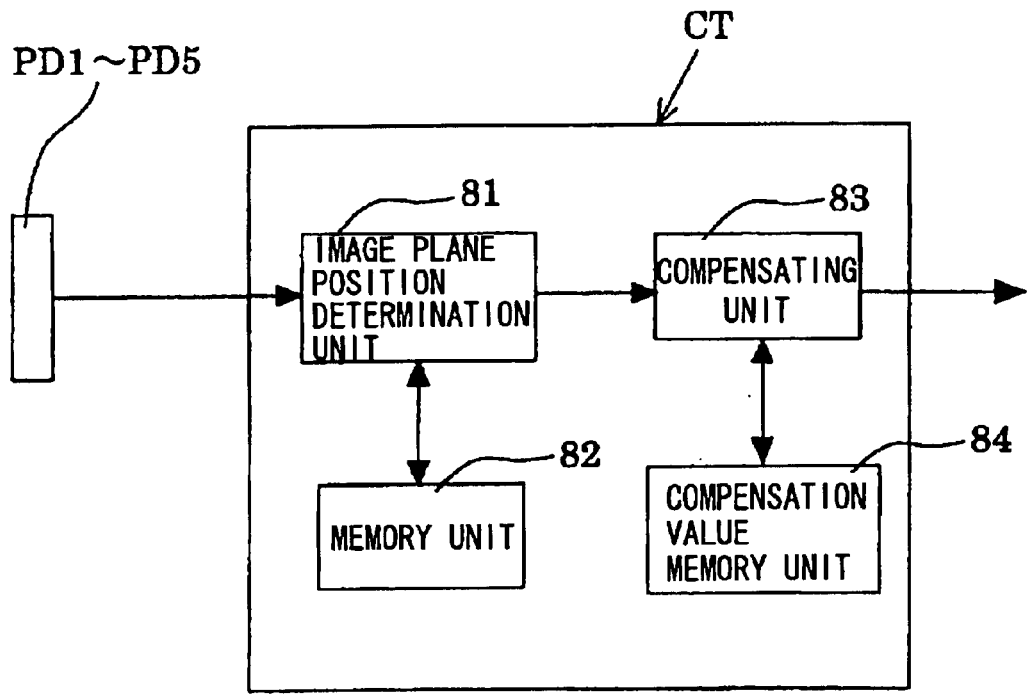
FIG. 8A is a diagram for schematically illustrating the inner structure of another example of a controller that is provided in the first embodiment.

FIG. 8A is a diagram for schematically illustrating the internal structure of another example of controller CT. In the same manner as the example shown in FIG. 7, with the example shown in FIG. 7, photodetectors PD1 to PD5, which are configured in the respective projection optical module PL1 to PL5, measure the change in light quantity. In controller CT, memory unit 82 is configured, which stores the correlation between the change in the position of image planes Ia to Ie of the projection optical modules PL1 to PL5, and the change in light quantity that is measured by each photo detector PD1 to PD5. In this manner, image plane determination unit 81 may find the amount of change in the position of image planes Ia to Ie of the projection optical modules PL1 to PL5 based on the change in light quantity information measured by photodetectors PD1 to PD5 and the correlation information that is stored in memory unit 82. The image plane position variance information is supplied to compensating unit 83 together with the change in light quantity information that is measured by photodetectors PD1 to PD5.

However, unlike the example shown in FIG. 7, compensation value memory unit 84 is configured in the example shown in FIG. 8A, instead of the compensation value calculating unit. Each of the compensation values corresponding to the curvature of field of respective image planes Ia to Ie of each projection optical module PL1 to PL5 may be stored in compensation value memory unit 84. At this point, each compensation value is the compensation value that is found by testing, for example, each of the projection optical modules PL1 to PL5. With compensating unit 83, each of the position variance values of image planes Ia to Ie of each projection optical modules PL1 to PL5 that are supplied from image plane position determination unit 81 may be respectively compensated based on each compensation value that is obtained from compensation value memory unit 84 corresponding to the change in light quantity information that is measured. In the following, the focus adjustment operation and the magnification variance compensating operation are the same as in the example of FIG. 7. The example shown in FIG. 8A is particularly effective in cases where the change in curvature of field of each projection optical module PL1 to PL5 due to optical absorption has almost no effect on focal adjustment.

Figure 8B:
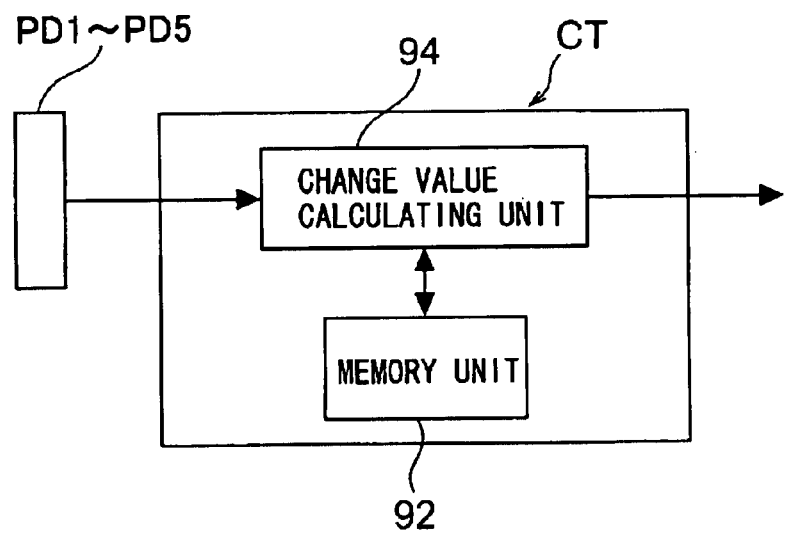
FIG. 8B is a diagram for schematically illustrating the inner structure of yet another example of a controller CT that is provided in the first embodiment.

FIG. 8B is a diagram for schematically illustrating the internal structure of yet another controller CT. According to this example, controller CT comprises a memory unit 92 that stores the correlation of the change in the position in a focusing direction of the portion that contributes to the formation of the partially overlapping exposure area in image planes Ia to Ie of each projection optical module PL1 to PL5, and the change in light quantity that is measured by each photo detector PD1 to PD5. Then using change value calculating unit 94 of controller CT, the position change value of the portion that contributes to the formation of the partially overlapping exposure area in image planes Ia to Ie of each of projection optical modules PL1 to PL5 may be found based on the measured change in light quantity and the correlation information in memory unit 92. In this case as well, the focus adjustment operation and the magnification variance compensating operation are performed in the same manner as the examples shown in FIGS. 7 and 8A.

It is noted here that in the above description, the respective positions of image planes Ia to Ie of the projection optical modules PL1 to PL5 in a focusing direction are adjusted; however, it is possible to perform focal adjustment by combining the adjustment of the position of, for example, substrate P (or mask M) in a focusing direction and the adjustment of the position of image planes Ia to Ie of the projection optical modules PL1 to PL5 in a focusing direction. Specifically, the position of substrate P is aligned relative to the change in the position of the image plane of one certain projection optical module, and the position of the image plane of another projection optical module is aligned relative to the position of this substrate P. Alternatively, after coarse focal adjustment is performed by changing the position of substrate P, fine adjustment is performed by changing the image plane position of each projection optical module PL1 to PL5.

Furthermore, in the above description, the emphasis is on performing focus adjustment; however, there are cases where there are mostly changes in projection magnification of each projection optical module PL1 to PL5 because of heat deformation of the lenses due to optical illumination. In this case, by changing the distance between the lenses of at least one of either mask side magnification compensating optical system Gm or substrate side magnification compensating optical system Gp by a very small amount, the change in projection magnification may be adjusted. Depending on the adjustment of the magnification change, there are cases where the image plane position of each projection optical module may worsen to the degree where compensation becomes necessary. In this case the space between the lenses of focus compensation optical system Gf is adjusted by only a very small amount to compensate the change in the image plane position that has worsened due to the adjustment of the magnification change.

Furthermore, in the case where mostly astigmatism develops in each projection optical module PL1 to PL5, for example, second concave reflecting mirror M2 (or first concave reflecting mirror M1) or at least one of the optical members within lens L1 or L2, which are disposed nearby, is moved slightly along optical axis AX2 to compensate for the astigmatism. Depending on the compensation of the astigmatism, there are cases where the image plane position and the distortion may worsen to the degree where compensation becomes necessary. In this case, the space between the lenses of the focus compensation optical system Gf is adjusted by only a very small amount to compensate the change in image plane position that has worsened due to the astigmatism. In addition, a lens that is effective for distortion may be moved slightly along the optical axis to compensate for the distortion change that has worsened due to the compensation of the astigmatism.

Figure 9:
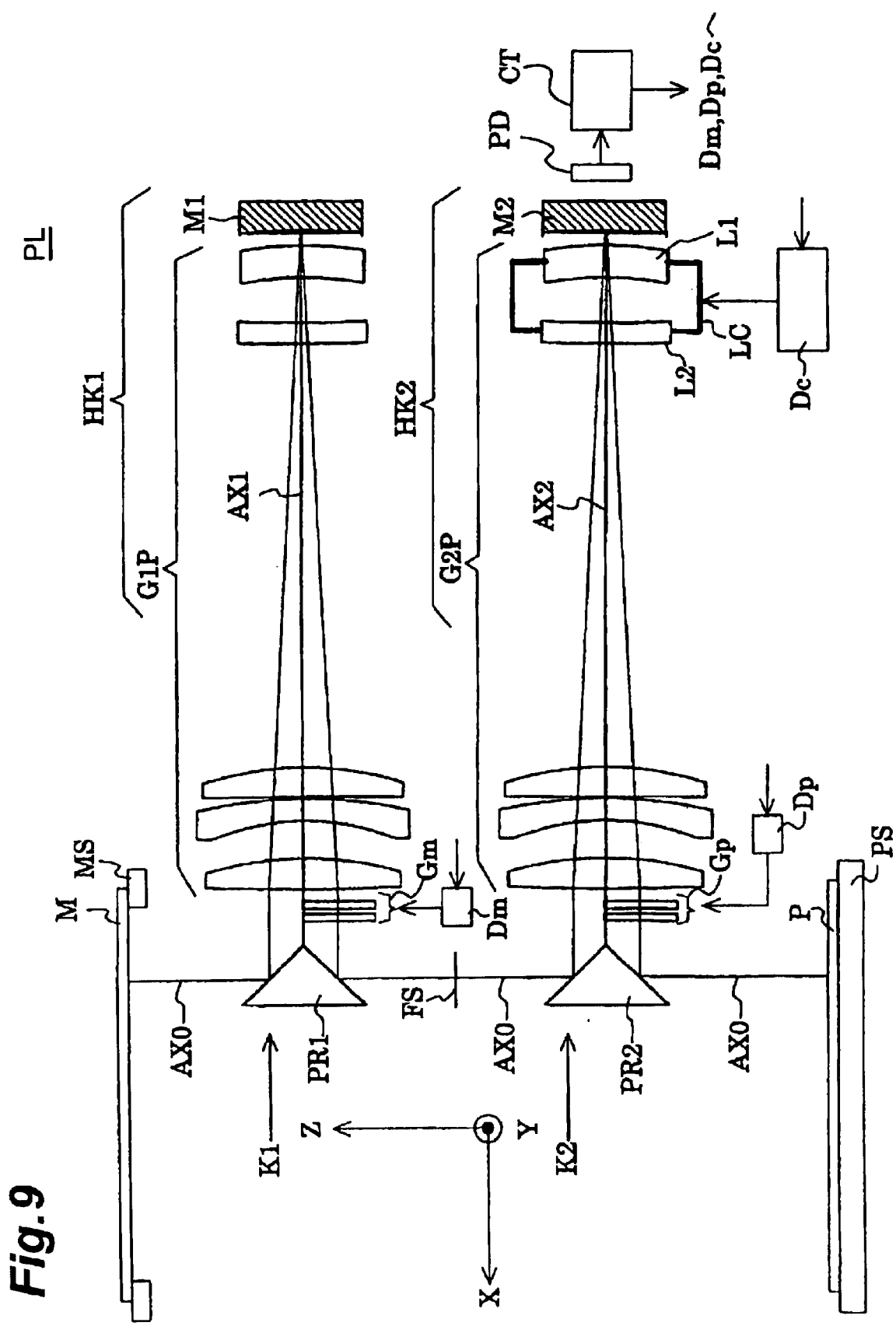
FIG. 9 is a diagram for schematically illustrating the partial structure of the first alternative example of the first embodiment.

FIG. 9 is a diagram that schematically illustrates the substantial part of the structure of the first alternate example of the first embodiment. In short, FIG. 9 schematically illustrates the structure of another example of a projection optical module, which is included by the exposure apparatus of the first embodiment. The projection optical module PL shown in FIG. 9 has a structure that is comparable to the projection optical module PL shown in FIG. 4. However, the example shown in FIG. 9 basically differs from that in FIG. 4 in the configuration of lens control chamber LC instead of focus compensation optical module. In the following, the projection optical module PL shown in FIG. 9 will be described while highlighting the points that differ from the projection optical module PL that is shown in FIG. 4.

As shown in FIG. 9, there is configured a lens control chamber LC that envelopes a pair of lenses L1 and L2, which are disposed near second concave reflecting mirror M2 (specifically, it is disposed near the pupil plane of the projection optical module), so as to seal off the space between them. It is structured so that the pressure of the enclosed space in this lens control chamber may be regulated by pressure regulator Dc, which operates in accordance with the command from controller CT. If the pressure of the enclosed space in lens control chamber LC is subjected to even a very small change, the position of the image plane of the projection optical module will change only a very small amount together with very small amount of distortion developing.

Accordingly, in the projection optical module of FIG. 9, for example, in the case where focus changes develop due to heat deformation of the lenses due to optical illumination, the pressure of the enclosed space in the lens control chamber LC is changed only a very small amount to perform focal adjustment. Depending on the focal adjustment, there are cases where distortion worsens to the degree that compensation becomes necessary. In this case, a lens that is effective for distortion may be moved slightly along the optical axis to compensate the distortion change that has worsened due to focal adjustment. It is noted here that it is possible to configure a lens control chamber so as to envelope the space between a plurality of lenses that are disposed near first concave reflecting mirror M1. Furthermore, it is also possible to configure a lens control chamber between optical elements (lenses) adjacent to first concave reflecting mirror M1 or second concave reflecting mirror M2 and optical elements (lenses) adjacent to them.

Figure 10:
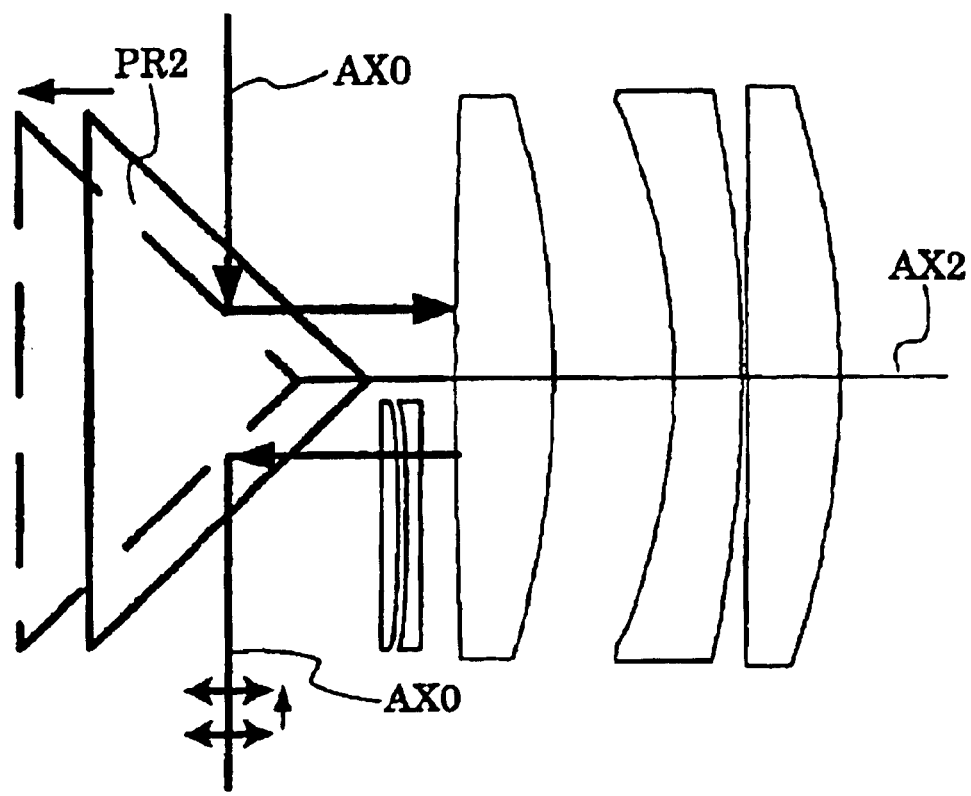
FIG. 10 is diagram for explaining the fact that the image plane positioning of each projection optical module may be controlled by jogging the second right-angle prism PR2 that is provided in the first embodiment.

Incidentally, even in cases where neither focus compensation optical system Gf nor lens control chamber LC are provided, as shown in FIG. 10, by slightly moving second right-angle prism PR2 along optical axis AX2 of second reflective/refractive optical system HK2, it is possible to adjust the image plane position of each projection optical module. It is noted here that it is also possible to perform focal adjustment of each projection optical module even if first right-angle prism PR1 is slightly moved along optical axis AX1 of first reflective/refractive optical system.

Furthermore, it is possible to adjust the image plane positioning of each projection optical module through the insertion of at least one parallel flat substrate that has been selected from a plurality of parallel flat substrates of differing thickness into the optical path between, for example, second right-angle prism PR2 and substrate P. In this case, it is possible to switch the parallel flat substrates using either the so-called turret method or the slide method. Moreover, it is possible to adjust the image plane position of each optical projection module by, for example, configuring a pair of cuneiform prisms in the optical path between second right-angle prism PR2 and substrate P and slightly moving at least one of the pair of cuneiform prisms in the direction perpendicular to axis AX0.

Figure 11:
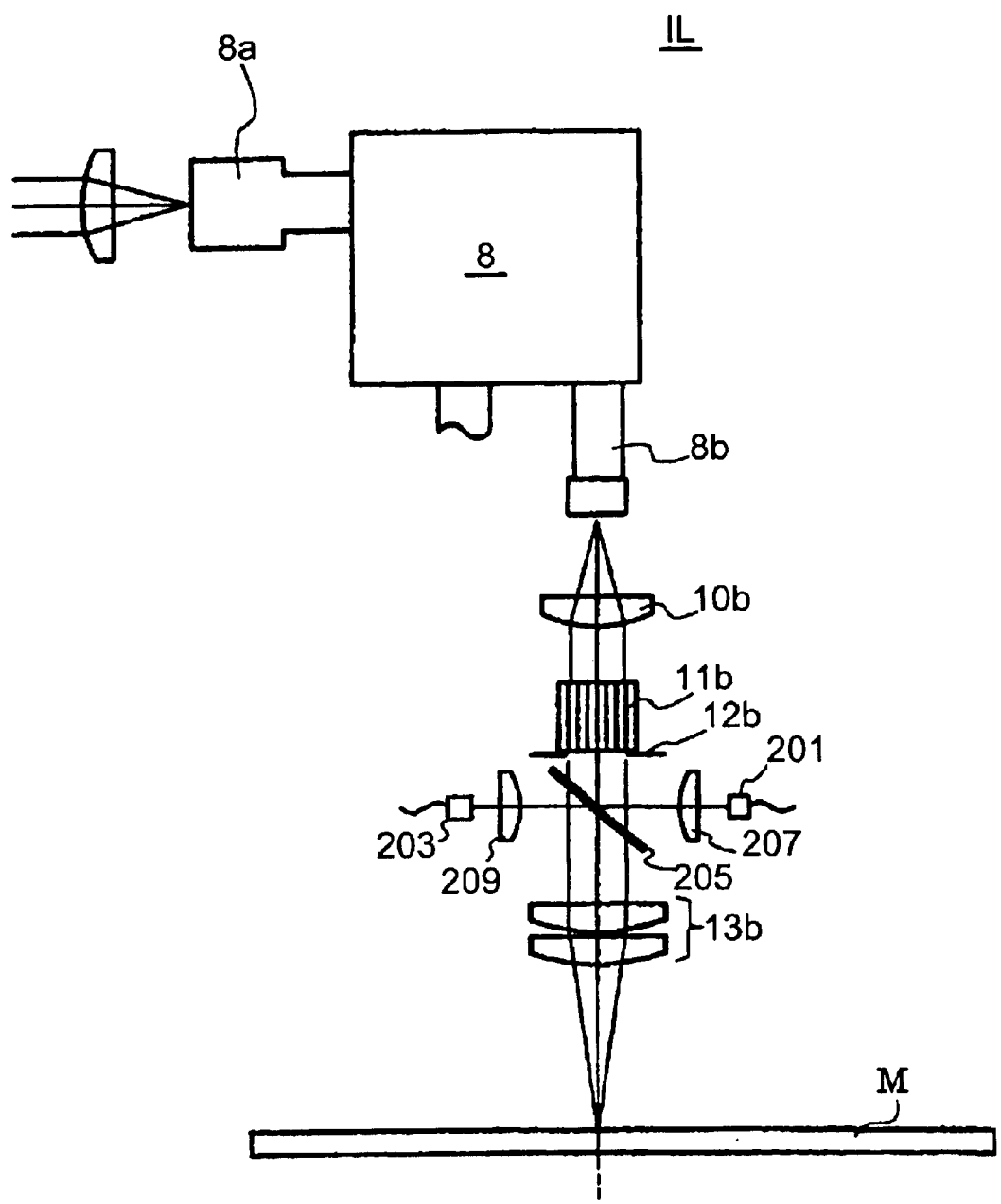
FIG. 11 is a diagram for schematically illustrating the partial structure of the second alternative example of the first embodiment.

FIG. 11 is a diagram that schematically illustrates the substantial part of the structure of the second alternative example of the first embodiment. In short, FIG. 11 schematically illustrates the structure of an alternative example in the illumination system that measures the light quantity change in each of the projection optical systems. In the following, the measurement of the light quantity change that happens in projective optical module PL1 is described. In FIG. 11 there is configured photodetector 201, which is used for detecting the portion of light that is incident to projection optical module PL1. Furthermore, there is configured photodetector 203, which is used for detecting the portion of return light that is reflected off substrate P through projection optical module PL1.

Specifically, the portion of light from the secondary light source that is formed near rear focal plane of fly-eye integrator 11b is reflected by beam splitter 205, passes through lens 207, and is detected by photodetector 201. On the other hand, a portion of the return light from substrate P is reflected by beam splitter 205, passes through lens 209, and is detected by photodetector 203. In this manner, it is possible to measure the light quantity change that is illuminated to projection optical module PL1 based on the detected results from photodetector 201, the detected results from photodetector 203 and the transmittance information of mask M. Furthermore, based on the same structure, it is possible to measure the light quantity change irradiated to the other projection optical modules PL2 to PL5.

It is noted here that the transmittance information of mask M is obtained by actually using a sensor to detect the illuminated light that passes through projection optical module PL1 and is incident on the exposure region of substrate P. Alternatively, in cases where the pattern of mask M is similar, it can be found by analogizing the transmittance information that has already been obtained through detection. It is also possible for the transmittance information of mask M to be computed based on the patterns of mask M. It is noted here that in the alternative example in FIG. 11, the return light is detected by photodetector 203; however, photodetector 203 may be omitted, and the light quantity change irradiated to projection optical system PL1 may be measured based on the detected results from photodetector 201, the transmittance information of mask, and the reflectivity information of substrate P.

It is noted here that in the first embodiment described above, based on the information of, for example, an estimated time for optical irradiation to each projection optical module PL1 to PL5, the maximum amount of displacement in a focusing direction of that image plane in a focusing direction may be found. In the case where the maximum amount of displacement computed is smaller than half of the focal depth of each projection optical module PL1 to PL5, then the image plane of each projection optical module PL1 to PL5 is originally set to the midpoint of the variation range of the image plane of each projection module PL1 to PL5. In this case, needless to say, each portion that contribute to the partially overlapping exposure regions in the image planes of the projection modules that are next to each other are set at nearly the same position in a focusing direction. Through this, there are substantially no negative effects by the change in the image planes (change in focus positioning) of each projection optical module, and scanning exposure may be repeated.

Furthermore, in the above description, the present invention is described focusing on changes in for example aberrations such as changes in the position of the image planes of each projection optical module PL1 to PL5, changes in magnification, astigmatism, and distortion; however, the present invention may be made suitable for changes in other aberrations in the same manner. Moreover, the present invention may be made suitable for changes in optical characteristics such as image shift and image rotation.

Specifically, due to optical illumination during exposure, not only is there heat deformation of the lenses that structure each projection optical module PL1 to PL5, but due to the heat deformation of deflecting members including members holding the prisms such as the right-angle prisms that form each projection optical modules PL1 to PL5, the image that is formed on substrate P may move (image shift) along the XY plane or rotate about the Z-axis (image rotation). Furthermore, image shift or image rotation may occur due to environmental factors such as the temperature grade in the chamber that envelops all of the projection optical modules PL1 to PL5.

Figure 12:
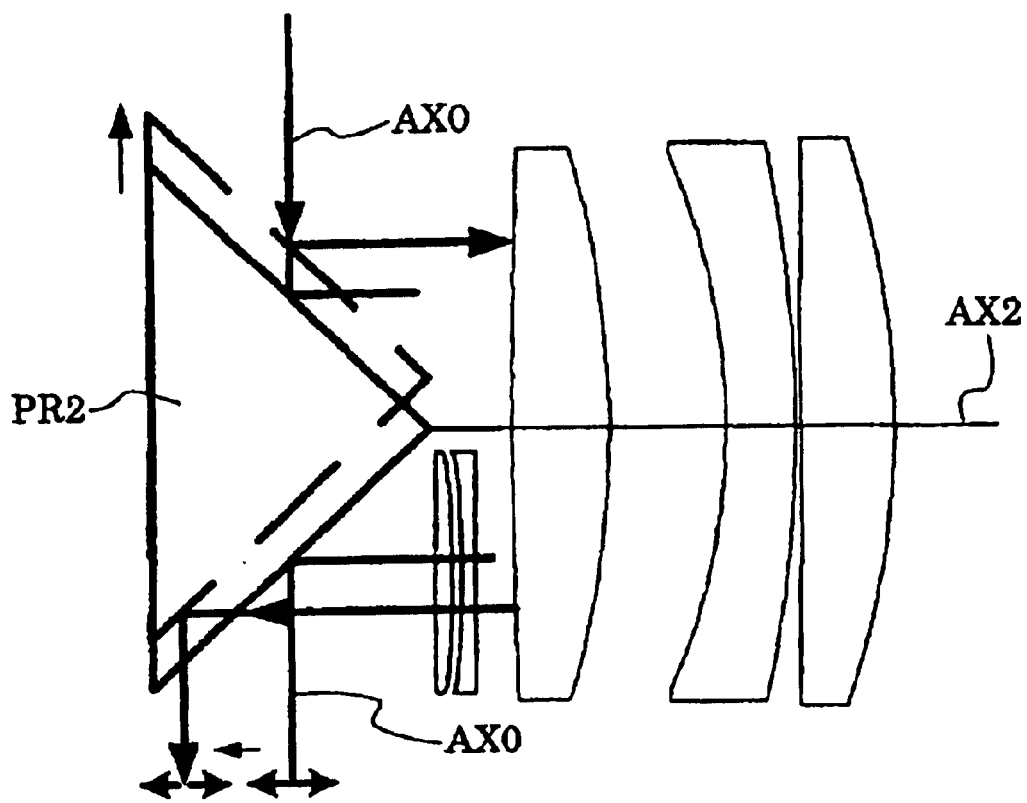
FIG. 12 is a diagram for explaining a typical image shift control method using second right-angle prism PRT, which is provided in the first embodiment.

FIG. 12 is a diagram that describes a typical object shift adjustment process. As shown in FIG. 12, based on, for example, information on the light quantity change and temperature grade information, the image shift may be adjusted for each projection optical module by slightly moving second right-angle prism PR2 along field center axis AX0. It is noted here that it is also possible to perform image shift adjustment by slightly moving first rectangular prism PR1 along field center axis AX0. Furthermore, by placing a parallel flat substrate in an optical path other than the optical path wherein light travels back and forth of each projection optical modules, for example the optical path between second right-angle prism PR2 and substrate P, and tilting this parallel flat substrate relative to axis AX0, the adjustment of image shift may be performed. Alternatively, it is also possible to perform image shift adjustment by placing a pair of cuneiform prisms in the optical path other than the optical path wherein light travels back and forth of each projection optical modules, for example the optical path between second right-angle prism PR2 and substrate P, and slightly moving at least one of this pair of cuneiform prisms along axis AX0.

Figure 13:
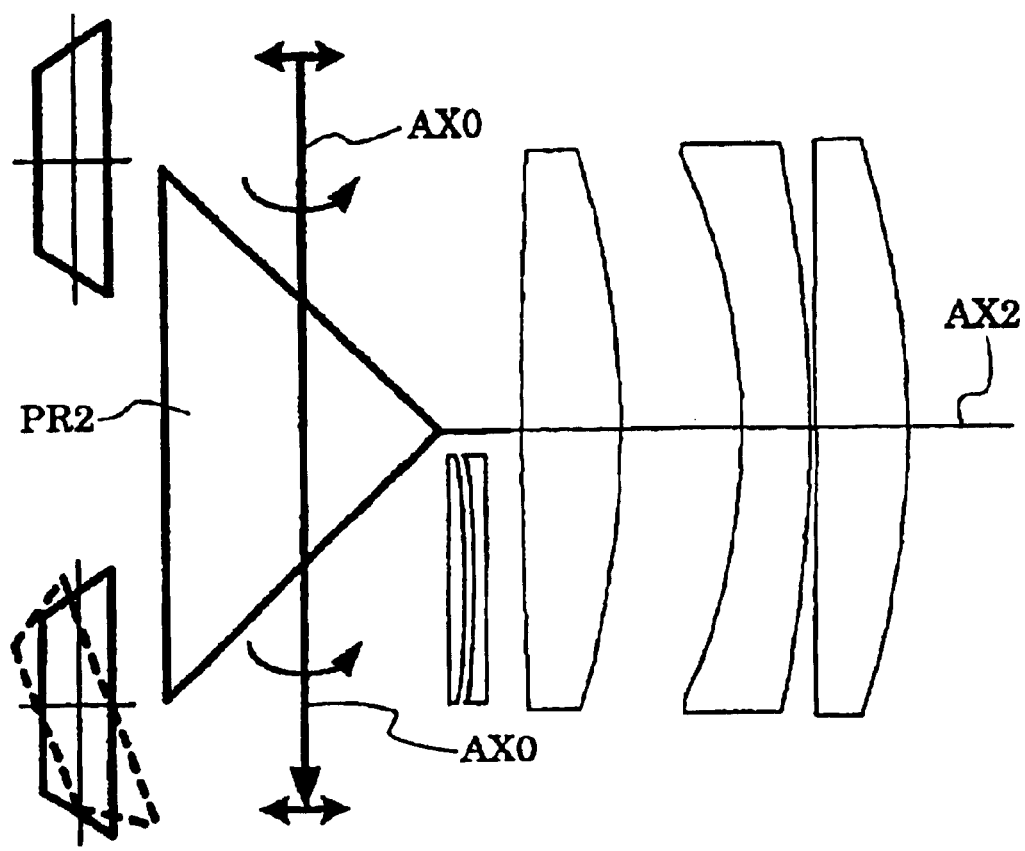
FIG. 13 is a diagram for explaining a typical image rotation control method using second right-angle prism PRT, which is provided in the first embodiment.

FIG. 13 is a diagram that describes a typical adjustment process for the image rotation. As shown in FIG. 13, it is possible to adjust the image rotation in each projection optical module by slightly rotating second right-angle prism PR2 about field center axis AX0 based on, for example, information on the light quantity change and temperature grade information. It is noted here that the adjustment of image rotation is also possible by slightly rotating first right-angle prism PR1 about field center axis AX0. Furthermore, it is possible to adjust image rotation by placing an image rotator in an optical path other than the optical path wherein light travels back and forth of each projection optical modules, for example the optical path between second right-angle prism PR2 and substrate P, and operating this image rotator.

Furthermore, as described above in the first embodiment, the present invention is described for a multi-scanning projection exposure apparatus that performs scanning exposure while moving a mask and a photosensitive substrate relative to a projection optical system comprising a plurality of projection optical modules. However, the present invention may be made suitable for an exposure apparatus that, instead of moving a mask and a photosensitive substrate relative to a projection optical system comprising a plurality of projection optical modules, performs a single exposure (ex, step and repeat exposure). Furthermore, it is also possible to adjust the focal position of the overlapping portions even in cases where the amount of light that passes through each projection optical module differs due to the device pattern.

(Second Embodiment)

In general, when light is irradiated to a lens, the temperature of the optical material of which the lens is comprised then rises due to optical absorption. As a result, thermal expansion occurs causing a change in the shape of the lens and therefore a change in its refractive power to happen. Then, when a light is irradiated to the lens, the density of the optical material making up the lens changes due to optical absorption. Accordingly, the refractive index of the lens changes, and therefore a change in its refractive power to happen.

Incidentally, the typical second embodiment of the present invention comprises an illumination system, which illuminates in a predetermined direction a plurality of regions of a mask, onto which a pattern to be transcribed is formed; and a projection optical system, which comprises a plurality of projection optical units, is arranged so as to correspond with the plurality of regions on the mask. The illumination system is configured in such a manner that the secondary light source is placed in a location almost optically conjugate with that of the pupil plane of each of the plurality of projection optical units. It is noted here that, as described in the first embodiment, the secondary light source is configured on, for example, the rear focal plane of fly-eye integrator 11b (FIG. 3).

In this case, it becomes to form an image of the secondary planar light source on the pupil plane of each projection optical unit, whereby the size and shape of luminous flux (zero-order transmitted light for the mask) that is incident to the lens disposed near the pupil plane remain constant; independent of changes in the size and shape of each illumination region on a mask (and also each exposure region on a photosensitive substrate). In addition, in each projection optical unit, the change in the refractive power of the lens disposed near the pupil plane contributes greatly to changes in optical characteristics of each projection optical unit, particularly, to changes in the focal point. In particular, when utilizing a multi-projection optical system, it is expected that the mask pattern density corresponding to the visual field of each projection optical unit is different from one another. For example, in the case of a general mask pattern, which allows much less light to be transmitted to the projection optical units located at the ends than to central projection optical units; since the amount of focal point change is extremely small in the projection optical unit sat the ends, it becomes difficult to bring all of the projection optical units into focus by only moving the position of substrate in the direction of the optical axis to focus.

Based on the above information, the inventors of the present invention came to the conclusion that the following two configurations are effective because the change in optical characteristics of each projection optical unit due to optical absorption in lenses, which form each projection optical unit, in particular changes in the focal point thereof, may be favorably suppressed (controlled). Namely, the first configuration allows the optical intensity distribution of the secondary light source to be set to an optical intensity distribution that is substantially stronger towards the peripheral portion than in the center, such as, for example, an annular (or doughnut shape) optical intensity distribution. Relay lens system 7 (FIG. 15), annular aperture stop 101b (FIG. 17), diffractive optic elements 111b (FIG. 18), and split lenses 121 (FIG. 19) is an example that may be used as setting unit that set this distribution. The configurations and operations of these elements will be described later. In addition, the second configuration allows the outer diameter of a secondary light source, when it is converted to a value on the pupil plane, to be set higher than the predetermined ratio to the clear aperture of the pupil plane.

According to the first configuration, the intensity of luminous flux incident to the center portion of the lens disposed near the pupil plane of each projection optical unit cannot be greater than the intensity of luminous flux incident to the peripheral portion. If the intensity of luminous flux incident to the center portion of the lens is strong, it is difficult for the distribution of temperature increase of the entire lens caused by optical absorption in this lens to be uniform, so that the refractive power of the lens may easily change. In other words, with the first configuration, when a luminous flux, with for example an annular optical intensity distribution, is incident to the lens disposed near the pupil plane of each projection optical unit, it becomes easy for the distribution of temperature increase in the center portion and the peripheral portion due to optical absorption in the lens to be uniform, the change in the refractive power to be suitably controlled, and the change in the optical characteristics of each projection optical unit to also be suitably controlled.

On the other hand, according to the second configuration, the diameter of luminous flux incident to the lens disposed near the pupil plane of each projection optical unit cannot be much less than its clear aperture. If the diameter of the incident luminous flux were to become much less, then the refractive power would change greatly in accordance with localized change in the shape of the center portion of the lens and localized change in the refractive index. In other words, with the second configuration, since the diameter of the luminous flux incident to the lens disposed near the pupil plane of each projection optical unit is larger than its clear aperture, the change in refractive power can be suitably controlled, and the change in the optical characteristics of each projection optical unit can also be suitably controlled.

As described above, with the second embodiment, it is possible to realize an exposure apparatus that can substantially control the change in optical characteristics of each projection optical unit due to optical absorption of lenses. Furthermore, it is possible to manufacture high quality, large screen microdevices, for example highly accurate LCD displays, through the favorable exposure obtained by using the exposure device according to the second embodiment.

In the following, the second embodiment of the present invention will be described while referring to the attached Figures.

Figure 14:
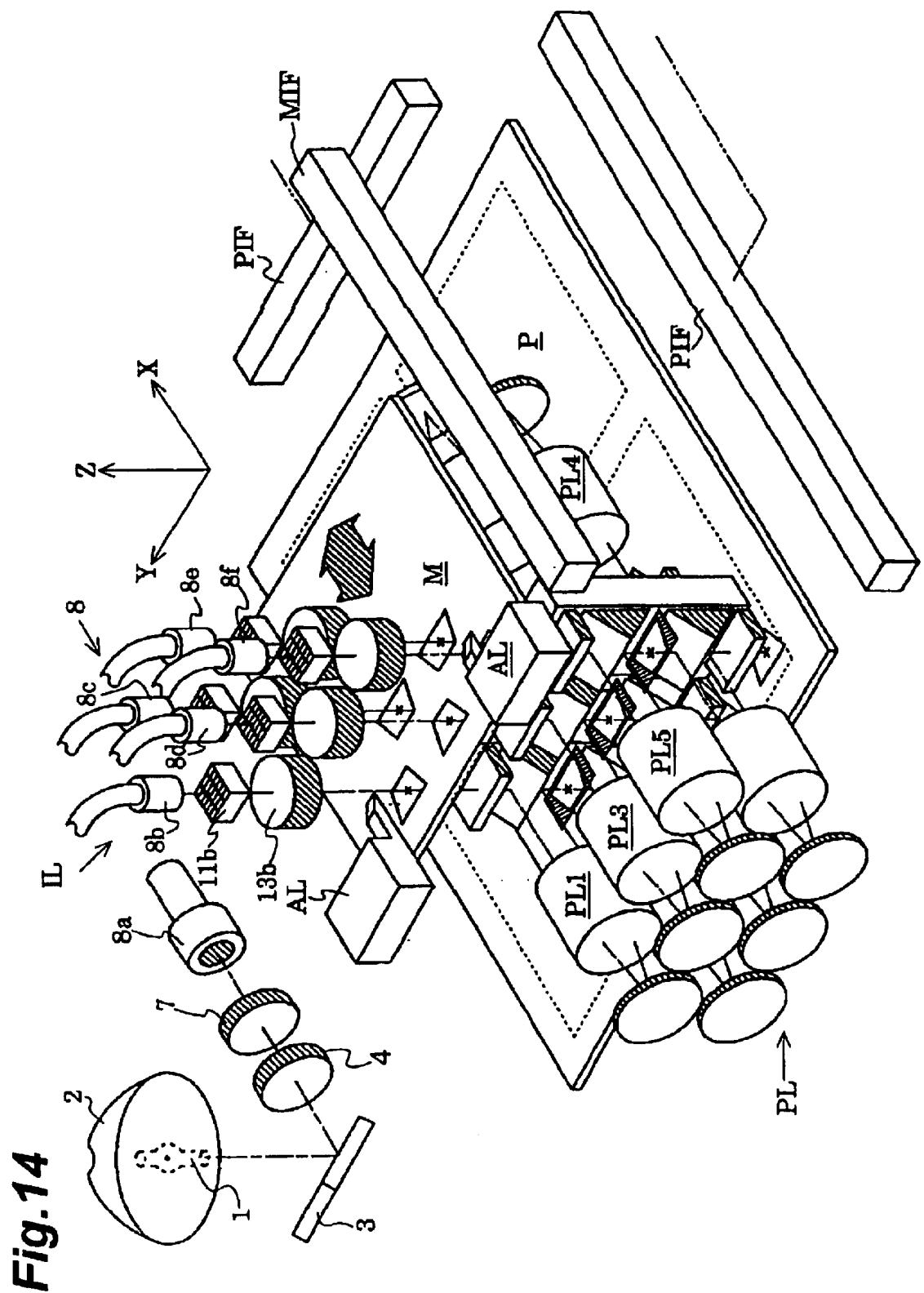
FIG. 14 is a perspective view for schematically illustrating the overall structure of an exposure apparatus according to the second embodiment.
Figure 15:
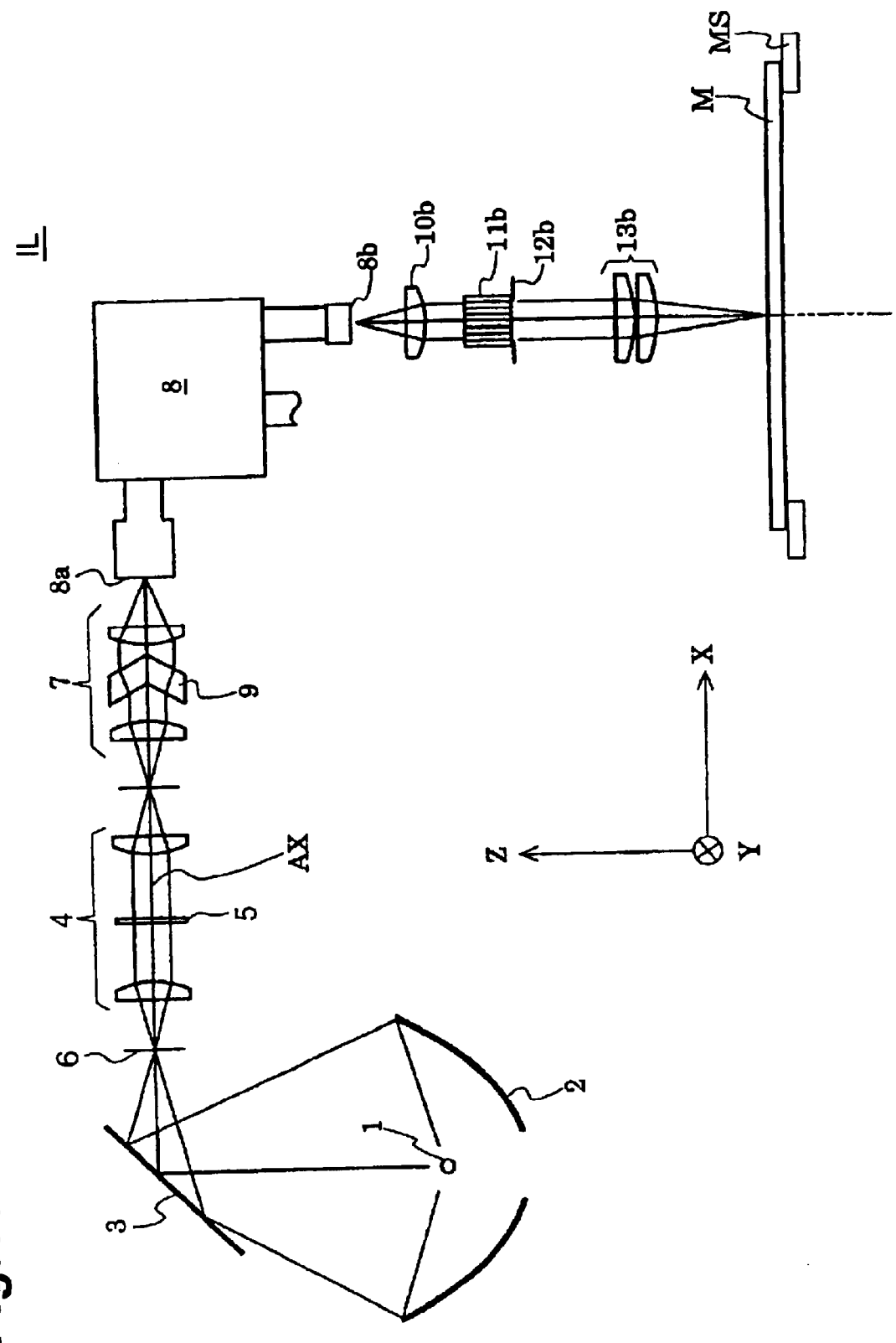
FIG. 15 is a diagram for schematically illustrating the structure of an illumination system in the exposure apparatus according to the second embodiment.
Figure 16:
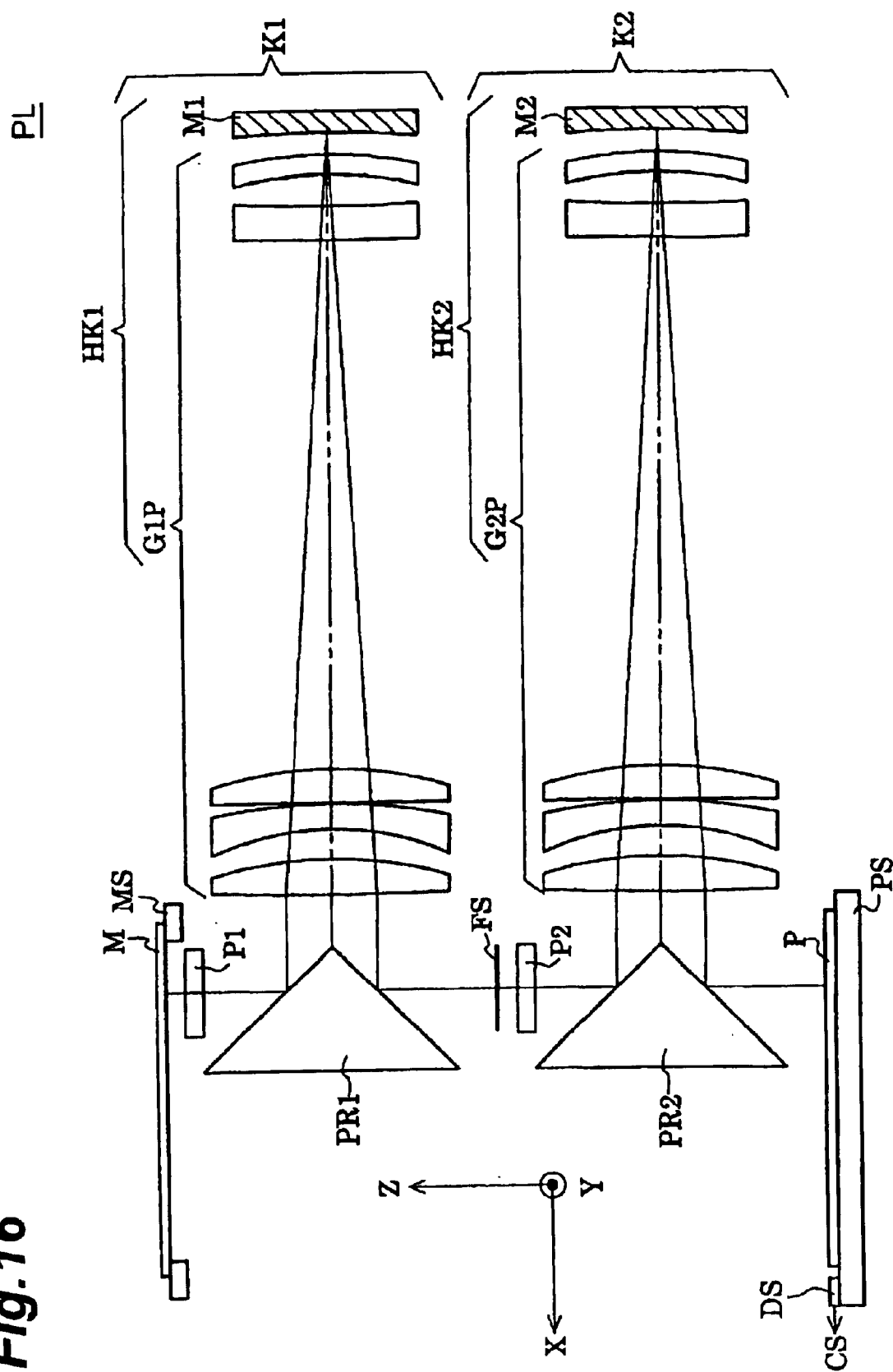
FIG. 16 is a diagram for schematically illustrating the structure of each projection optical unit that forms the projection optical system in the exposure apparatus according to the second embodiment.

FIG. 14 is a perspective view for schematically illustrating the overall structure of an exposure apparatus, according to the second embodiment of the present invention. In addition, FIG. 15 is a diagram for schematically illustrating the structure an illumination system in the exposure apparatus of FIG. 14. Moreover, FIG. 16 is a diagram for schematically illustrating the structure of each projection optical unit that forms a projection optical system in the exposure apparatus of FIG. 14. The second embodiment will be described in terms of differences with the first embodiment. Therefore, since the elements of the second embodiment shown in FIGS. 14 to 16 are assigned the same reference numeral as the same structural element shown in FIGS. 2 to 4, repetitive explanations are omitted accordingly.

According to the second embodiment, the present invention is applied to a multi-scanning projection exposure apparatus, which performing projection exposure of a mask pattern onto a substrate while shifting a mask and a substrate relative to a projection optical system comprising a plurality of reflection/refraction type projection optical units. The second focal point of elliptical mirror 2 exists in the optical path located between reflecting mirror (plane mirror) 3 and relay lens system 4, and shutter 6 is disposed at this location.

Relay lens system 7 is positioned in the optical path between relay lens system 4 and incident end 8a. Divergent luminous flux traveling from the light source image formed through relay lens system 4 contributes to reproduction of an image near incident end 8a of light guide 8 by relay lens system 7. Conical prism (annular light formation material) 9, which is used as an axicon, is disposed near the pupil plane of relay lens system 7. Conical prism 9 has the face on the light source side (the face on the left side of FIG. 15) configured in a conically concave shape, with the face that faces the mask side (the side on the right side of FIG. 15) configured in a conically convex.

In more detail, the refractive surface towards the mask side and the refractive surface towards the light source side of conical prism 9 correspond to the conical surface (the side except for the base) of a symmetrical cone about optical axis AX, and two refractive surfaces are configured nearly parallel to each other. Accordingly, the circular luminous flux incident to conical prism 9 is deflected in all directions at equal angles with optical axis AX as a center, and then transformed into annular (or doughnut shape) luminous flux. In this manner, conical prism 9 has a function allowing circular luminous flux to transform into annular luminous flux.

In projection optical system PL, plane-parallel substrates P1 and P2, which are used as an image shifter, are positioned within an optical path located between mask M and the first reflecting surface of the first right-angle prism PR1 and within an optical path located between field stop FS and the first reflecting surface of the second right-angle prism PR2, respectively; wherein said image shifter is unit for translating (shifting) the position of an image formed on substrate P, in the X-direction and Y-direction. Accordingly, plane-parallel substrates P1 and P2 are configured in a manner such that they are capable of being revolved about the X-axis and also Y-axis.

According to the second embodiment, as described above, since conical prism 9 is disposed near the pupil plane of the second relay lens system 7, incident circular luminous flux to conical prism 9 is transformed into nearly annular luminous flux. Accordingly, the optical intensity distribution of the illuminated field formed on the incident surface of each of fly-eye integrator 11b to 11f is near annular shape and the secondary light source is formed near the emitting end with a nearly annular optical intensity distribution. The image of the secondary light source with said nearly annular optical intensity distribution is formed near the pupil plane of each projection optical unit PL1 to PL5.

Accordingly, luminous flux with said nearly annular optical intensity distribution is incident to the lens disposed near the pupil plane of each projection optical unit PL1 to PL5, namely the lens disposed near the first and second concave reflecting mirrors M1 and M2. As a result, the temperature increase distribution of the center portion and peripheral portion of the lens disposed near the pupil plane of each projection optical unit PL1 to PL5, which is caused by optical absorption in the lens, is apt to be uniform, allowing the refractive power change to be favorably controlled, and changes in the optical characteristics of each projection optical unit, more specifically the change in the focal point to also be controlled.

Figure 17:
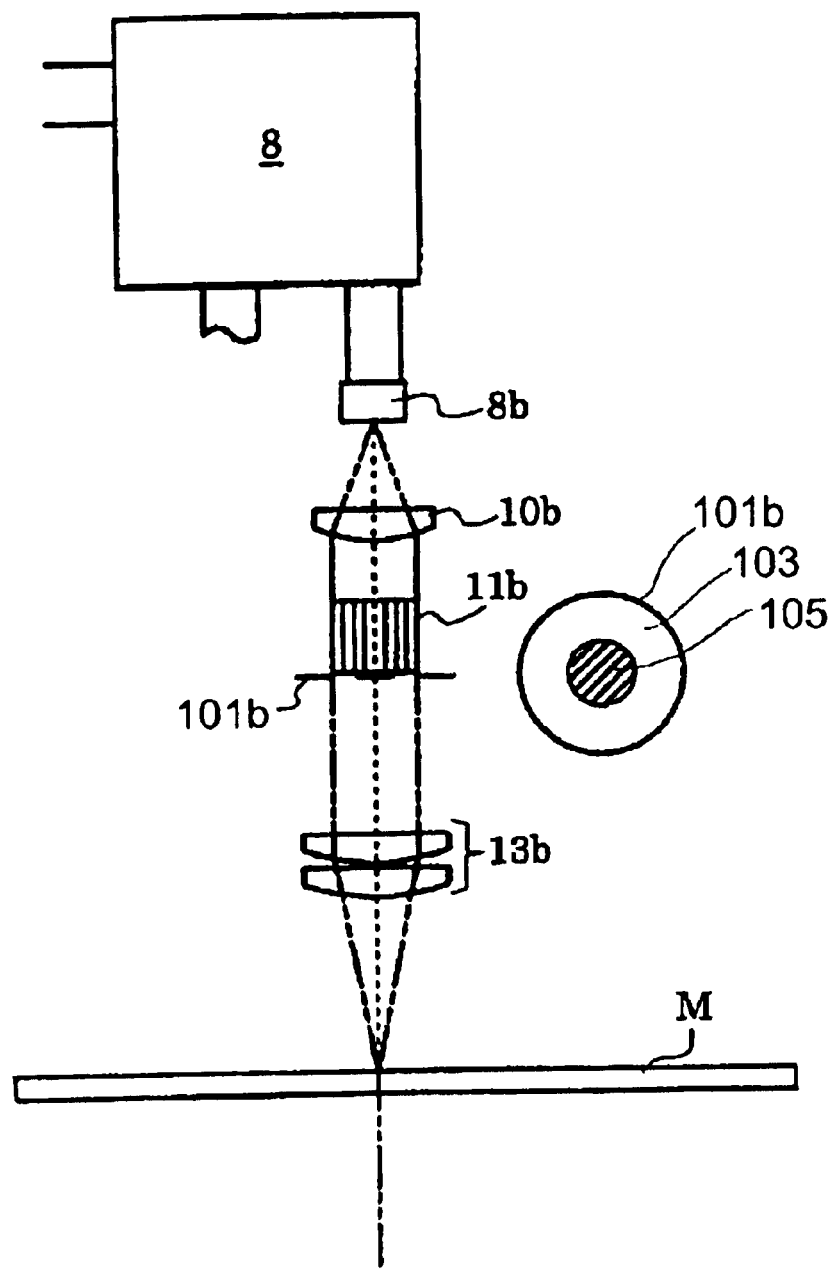
FIG. 17 is a diagram for schematically illustrating the partial structure of the first alternative example of the second embodiment.

FIG. 17 is a diagram for schematically illustrating the partial structure of the first alternative example of the second embodiment, which uses an annular aperture stop as each aperture stop. As shown in FIG. 17, annular aperture stops 101b to 101f are fabricated with annular opening 103 in the peripheral portion of shade 105. When annular aperture stops 101b to 101f are used as the respective aperture stops 12b to 12f, the optical intensity distribution of the secondary light source disposed near the emitting end of each fly-eye integrator 11b to 11f is controlled to be an annular shape. In this case, luminous flux with a nearly annular optical intensity distribution is incident to the lens disposed near the pupil plane of each projection optical unit PL1 to PL5. Accordingly, compared to the case of using only conical prism 9, in the case where conical prism 9 is used together with annular aperture stops 101b to 101f, light quantity loss occurs in each of annular aperture stops 101b to 101f; however, the temperature increase distribution due to optical absorption is apt to be uniform.

Alternatively, in this embodiment, annular aperture stops 101b to 101f may be used as aperture stops 12b to 12f, respectively, without using conical prism 9. In this case, as compared to the case of using conical prism 9 together with annular aperture stops 101b to 101f, light quantity loss in each of annular aperture stops 101b to 101f increases. However, compared to the case where only conical prism 9 is used, since a nearly annular optical intensity distribution is incident to the lens disposed near the pupil plane of each projection optical unit PL1 to PL5, the temperature increase distribution due to optical absorption is apt to be uniform.

Incidentally, as described above, in order to favorably control changes in optical characteristics of each projection optical unit PL1 to PL5, in particular changes in the focal point, it is preferable to set the outer diameter of the secondary light source when it is converted to a value in the pupil plane of each projection optical unit PL1 to PL5, to the value for a given ratio relative to the clear aperture of the pupil (e.g., greater than 0.7 times the pupil clear aperture), without regard to whether the secondary light source is an annular or circular shape. It is noted here that the outer diameter of the secondary light source, when it is converted to a value in the pupil plane, is no less than the outer diameter of the secondary light source image that is formed on the pupil plane of each projection optical unit PL1 to PL5 by the zero-order transmitted light of mask M (transmitted light except for the diffractive transmitted light).

In this case, the diameter of the luminous flux incident to the lens disposed near the pupil plane of each projection optical unit PL1 to PL5 is somewhat larger than its clear aperture. This is because the diameter of the luminous flux incident to the lens corresponds to the outer diameter of the secondary light source when it is converted to the pupil plane, whereas the size of the clear aperture of the lens corresponds to the size of the clear aperture in the pupil plane. As a result, a large amount of change in the refractive power caused by a localized change in the shape of the center portion of the lens and a localized change in the refractive index is prevented, and a change in the optical characteristics of each projection optical unit PL1 to PL5, in particular changes in the focal point are favorably controlled.

Incidentally, according to the second embodiment, in order to set the outer diameter of the secondary light source formed near the emitting end of each fly-eye integrator 11b to 11f to a given value, it is necessary to set the outer diameter of the illumination field formed on the incident surface of each fly-eye integrator 11b to 11f to a desired value. And, In order to set the outer diameter of this illumination field to a desired value, it is necessary to set the numerical aperture of the luminous flux emitted from each emitting end 8b to 8f of light guide 8 to a desired value. Since the numerical aperture of the incident luminous flux from light guide 8 is maintained, in order to set the numerical aperture of the luminous flux emitted from light guide 8 to a desired value, it is necessary to set the numerical aperture of the luminous flux incident to the incident end 8a of light guide 8 to a desired value.

Incidentally, the numerical aperture of the incident luminous flux to incident end 8a of light guide 8 depends upon the magnification of relay lens system 7. More specifically, a low magnification of relay lens system 7 causes the numerical aperture of the incident luminous flux to incident end 8a of light guide 8 to increase. On the other hand, the maximum numerical aperture of the incident luminous flux that can be propagated through the inside of light guide 9 depends upon the characteristics of the fiber strands comprising light guide 8. Accordingly, with this embodiment, in order to set the outer diameter of the secondary light source formed near the emitting end of each fly-eye integrator 11b to 11f to a given size, it is necessary to set the maximum numerical aperture for incident luminous flux, which can be propagated through light guide 8, to the largest value within reason; and it is also necessary to set the magnification of relay lens system 7 to a desired magnification so that the maximum numerical aperture can be almost equal to the numerical aperture for the luminous flux incident to incident end 8a of light guide 8.

Figure 18:
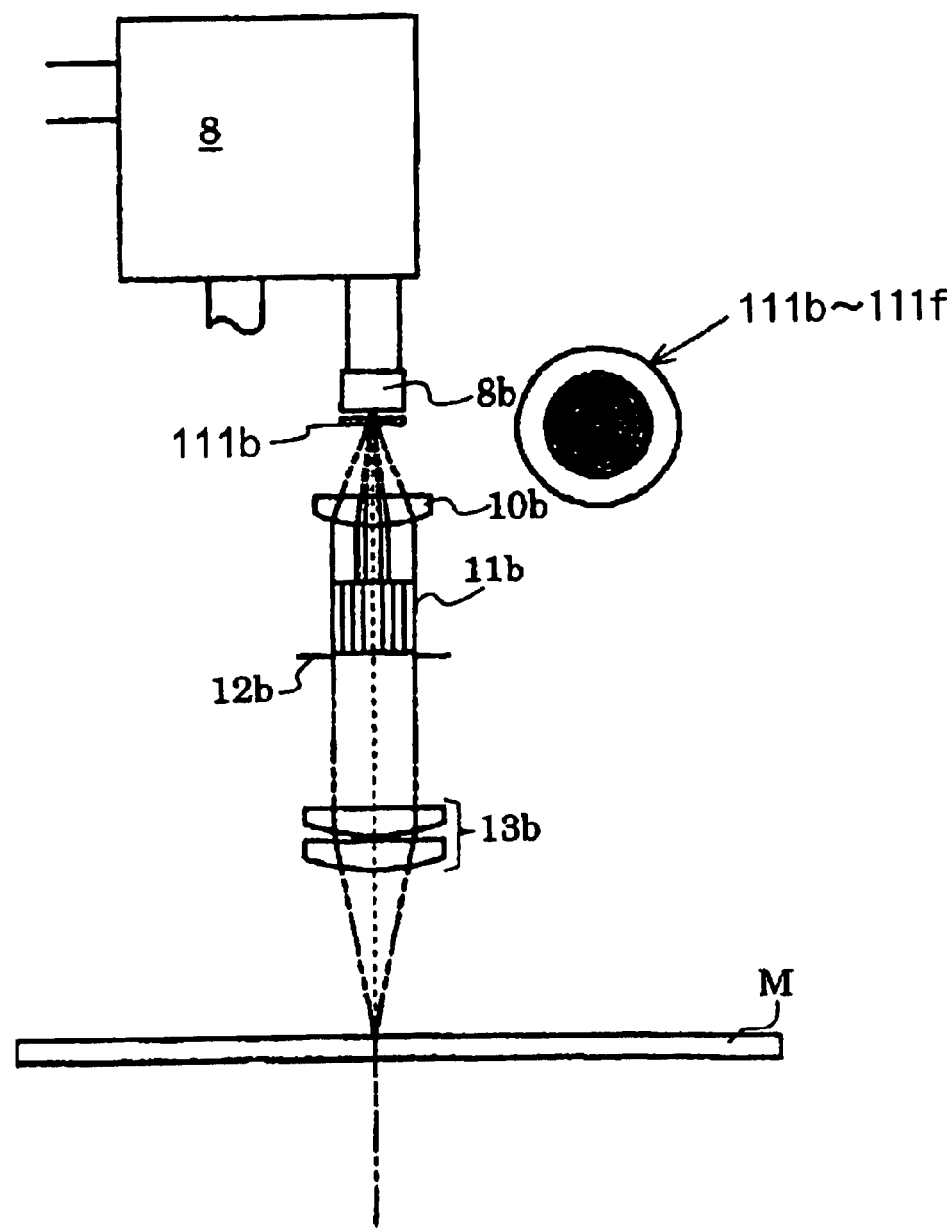
FIG. 18 is a diagram for schematically illustrating the partial structure of the second alternative example of the second embodiment.

FIG. 18 is a diagram for schematically illustrating the partial structure of the second alternative example according to the second embodiment that uses a diffractive optic elements in place of the conical prism with which an annular luminous flux is made. According to the second alternative example, as shown in FIG. 18, diffractive optic elements (DOE) 111b to 111f are each disposed near each of emitting ends 8b to 8f of light guide 8. In other words, diffractive optic elements 111b to 111f are disposed near the front side focal point of collimate lenses 10b to 10f. Diffractive optics 111b to 111f are configured by forming grades on a glass substrate with a pitch of approximately the wavelength of the exposure light (illumination light), and has a function of diffracting incident beams at a desired angle.

According to the second alternative example, diffractive optic elements 111b to 111f are configured so that zero-order transmitted light cannot actually occur and thereby only ±first-order diffractive transmitted light can be utilized. Accordingly, an almost annular illuminated field is formed via each of diffractive optic elements 111b to 111f and each of collimate lenses 10b to 10f on the incident surface of each fly-eye integrator 11b to 11f, whereas an almost annular secondary light source is formed near the emitting end. Furthermore, as described above, since the diffractive light passing through diffractive optic elements 111b to 111f is utilized, the incident luminous flux is diffused by diffractive optic elements 111b to 111f and therefore the incident luminous flux is enlarged and it is advantageous for enlarging the outer diameter of the annular secondary light source formed near the emitting end of each fly-eye integrator 11b to 11f.

In this sense, according to the second alternative example, it is also possible to configure diffractive optic elements 111b to 111f to use zero-order transmitted light and ±first-order diffractive transmitted light. In this case, a circular, secondary light source is formed near the emitting end of each fly-eye integrator 11b to 11f; however, the outer diameter of the circular, secondary light source may be set to be large in accordance with the luminous flux diffusion operation of diffractive optic elements 111b to 111f. In this case, like the case of forming the annular secondary light source through diffractive optic elements 111b to 111f, the change in the optical characteristics of each projection optical unit PL1 to PL5, in particular the change in the focal point is favorably controlled. It is noted here that an annular aperture stop may be also used in the second alternative example.

Figure 19:
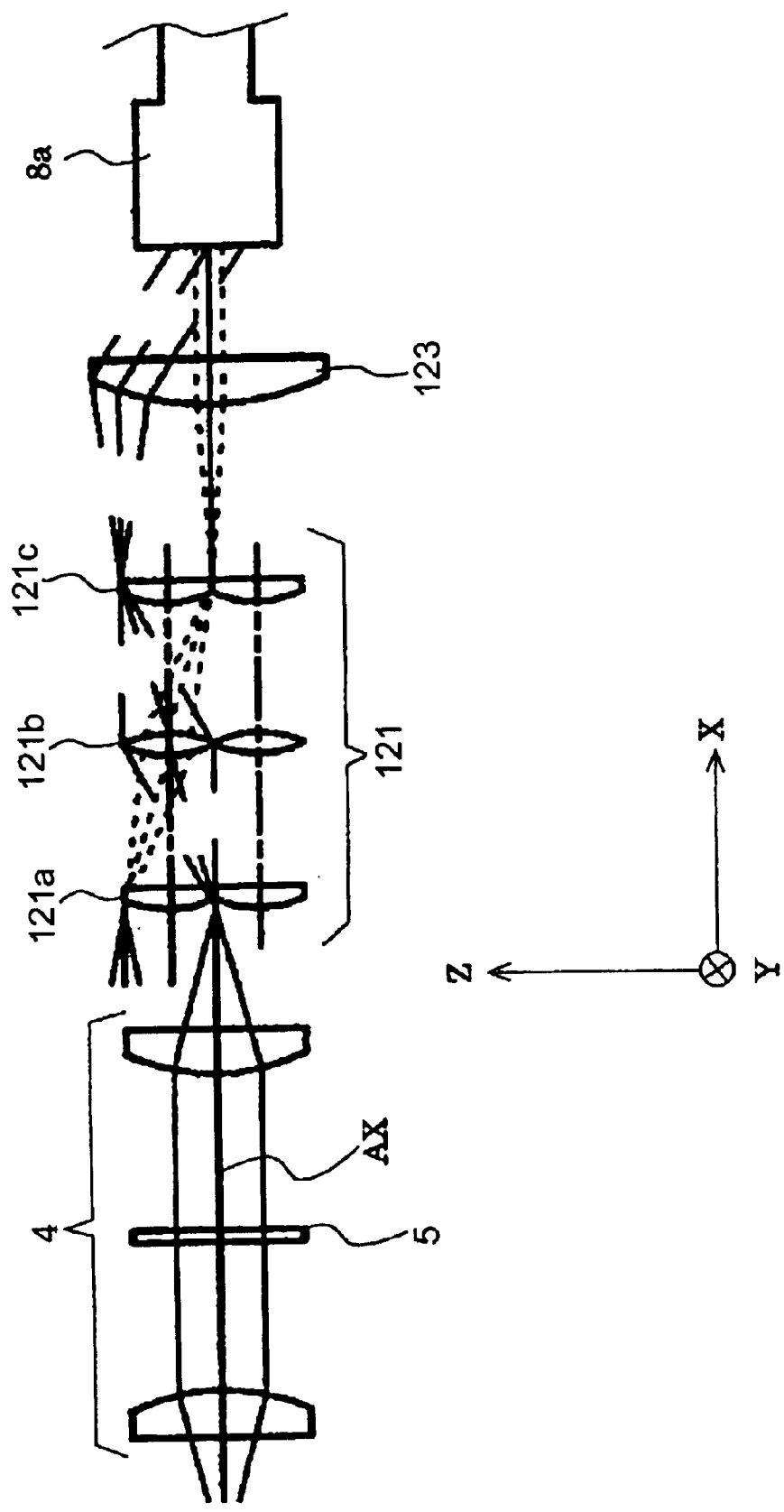
FIG. 19 is a diagram for schematically illustrating the structure of the substantial part of the third alternative example of the second embodiment.

FIG. 19 is a diagram for schematically illustrating the partial structure of the third alternative example of the second embodiment. According to the third alternative example, as shown in FIG. 19, split lenses 121 and lens 123 are disposed in an optical path located between relay lens system 4 and the incident end 8a of light guide 8. Split lens group 121 is comprised of first split lens 121a, second split lens 121b, and third split lens 121c arranged from light source side. Each split lens 121a to 121c comprises four positive lens components positioned in the respective four regions partitioned by the Z-axis and Y-axis with optical axis AX as the center.

The incident surface of first split lens 121a is positioned near where a light source image is formed through relay lens system 4. As shown in FIG. 19, lens group 121 and lens 123 allow the location where the light source image is formed through relay lens system 4 nearly conjugate with incident end 8a of light guide 8. In other words, a light source image is formed on incident end 8a of light guide 8 in the same manner as described in the second embodiment in FIG. 15. It is noted here that, as shown in FIG. 19, with split lens group 121, light emitted from optical axis AX near the incident surface of first split lens 121a converges at a location apart from optical axis AX near the emitting end of third split lens 121c. On the other hand, light emitted from an location apart from optical axis AX near the incident surface of first split lens 121a converges on optical axis AX near the emitting end of third split lens 121c.

Incidentally, in the case of using a extra-high pressure mercury vapor lamp as light source 1, the numerical aperture of the light coming from the center region of the light source image formed through relay lens system 4 (i.e., the numerical aperture of the light coming from the optical axis AX) is substantially greater than the numerical aperture of the light coming from the peripheral regions (i.e., the numerical aperture of the light coming from the location apart from optical axis AX). Furthermore, in the case where conical prism 9 is not configured in the second embodiment of FIG. 15, the optical intensity distribution of the circular secondary light source formed near the emitting end of each fly-eye integrator 11b to 11f is a distribution with the strongest intensity at the center region and decreasing intensity towards its peripheral portion.

In contrast, according to the third alternative example, as shown in FIG. 19, high numerical aperture light coming from the center portion of the light source image formed through relay lens system 4 is incident to incident end 8a of light guide 8 at a certain large angle. In this case, if the angle of incidence of the light coming from the center portion of the light source image to incident end 8a of light guide 8 is set to a substantially larger than the angle corresponding to the maximum numerical aperture of incident luminous flux, which can propagate through light guide 8, then a portion of the light coming from the center portion of the light source image does not propagate through the inside of light guide 8, and does not contribute to formation of the secondary light source.

This consequently allows the optical intensity distribution of the circular secondary light source formed near the emitting end of each of fly-eye integrators 11b to 11f to be a optical intensity distribution wherein the peripheral portion thereof has a substantially higher intensity than that of the center portion. Accordingly, with the third alternative example, as in the case of the annular secondary light source being formed, the change in the optical characteristics of each projection optical unit PL1 to PL5, in particular the change in the focal point can be favorably controlled. It is noted here that, according to the third alternative example, an annular aperture stop may be additionally used.

Figure 20A:
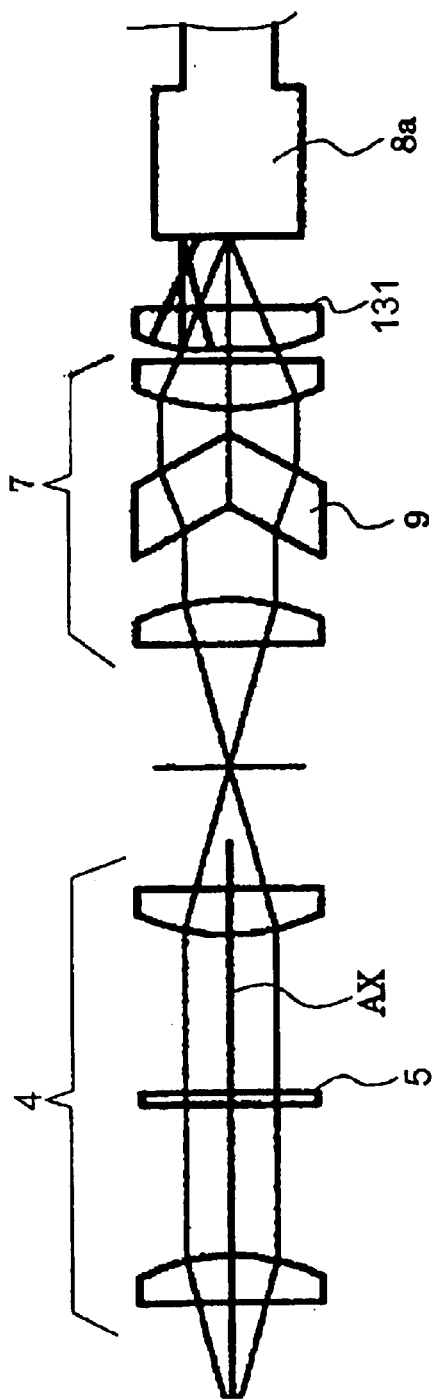
FIG. 20A is a diagram for schematically illustrating the structure of the substantial part of the fourth alternative example of the second embodiment.
Figure 20B:
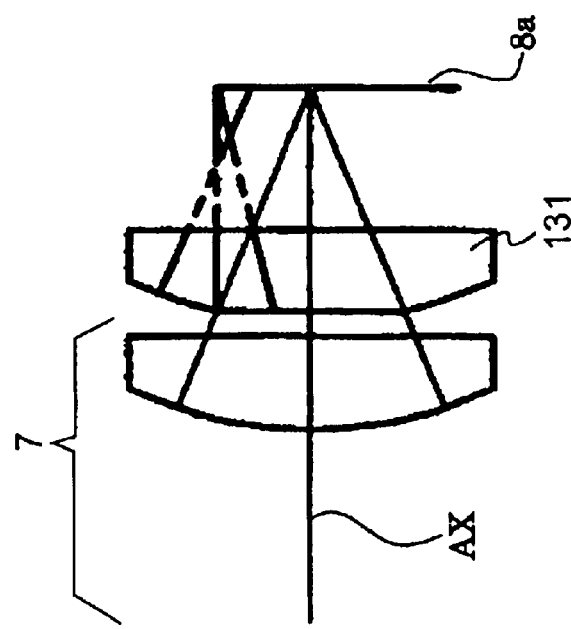
FIG. 20B is an enlarged view of a deformed lens that is provided in the fourth alternative example of the second embodiment.

FIG. 20A is a diagram for schematically illustrating the structure of the substantial part of the fourth alternative example, according to the second embodiment. According to the fourth alternative example, as shown in FIG. 20A, deformed lens 131 is disposed in the optical path located between relay lens system 7 and incident end 8a of light guide 8. Deformed lens 131, as shown in the enlarged view of FIG. 20B, is a planoconvex lens with its entirely planar surface facing the mask side, and also with its center portion of the light source side lens surface partly deformed into evenness. Accordingly, the center portion of deformed lens 131 plays a role as a plane-parallel substrate, whereas the doughnut shape region of the peripheral portion plays the role of a planoconvex lens.

With this configuration, according to the fourth alternative example, the light with highly numerical aperture coming from the center portion of the light source image formed through relay lens system 4 is incident, as it is, to the center portion of incident end 8a of light guide 8 through the plane-parallel substrate comprising the center portion of deformed lens 131. On the other hand, a part of light with low numerical aperture coming from the peripheral portion of the light source image formed through relay lens system 4 is deflected towards optical axis AX side through the planoconvex lens comprising the peripheral portion of deformed lens 131. Therefore, the numerical aperture of luminous flux, which is incident to the peripheral portion of incident end 8a of light guide 8, is greater due to the operation of deformed lens 131.

This consequently allows for a decrease in the intensity on the inside but an increase in the intensity on the outside in the optical intensity distribution of the annular secondary light source formed near the emitting end of each fly-eye integrator 11b to 11f. Also, under certain circumstances, even without conical prism 9, the intensity on the inside of the optical intensity distribution of the circular secondary light source may decrease whereas the intensity on the outside may increase, resulting in providing a optical intensity distribution with its peripheral portion having a higher intensity than that of the center portion. Accordingly, also in the fourth alternative example, the change in the optical characteristics of each projection optical unit PL1 to PL5, more specifically the change in the focal point is favorably controlled. It is noted here that, according to the fourth alternative example, an annular aperture stop may be additionally used.

Incidentally, in the case where a extra-high pressure mercury vapor lamp is used as light source 1, as shown in FIG. 15, the center portion of the reflecting surface of elliptical mirror 2 has a certain degree of loss. Accordingly, by reducing the magnification of relay lens system 7 to set the numeric aperture of the luminous flux incident to incident end 8a of light guide 8 to be greater, the optical intensity distribution of the secondary light source formed near the emitting end of each fly-eye integrator 11b to 11f comes under the influence of the central loss in the reflecting surface of elliptical mirror 2.

In other words, under certain circumstances, even without conical prism 9, the intensity on the center portion of the circular secondary light source to be formed comes on the influence of the central loss of the reflecting surface of elliptical mirror 2 and decreases, resulting in providing a circular secondary light source with a optical intensity distribution with its peripheral portion having substantially higher intensity than that of the center portion. This consequently allows the change in the optical characteristics of each projection optical unit PL1 to PL5, in particular the change in the focal point to be favorably controlled. In this case, an annular aperture stop may be additionally used.

It is noted here that, with to the above-mentioned second embodiment, in order to control a change amount in the focal point of each projection optical unit PL1 to PL5 (a change amount in the focusing direction of the image plane) into less than half the focal depth of each projection optical unit PL1 to PL5, setting the optical intensity distribution of the secondary light source and its outer diameter to a desired distribution and a desired value, respectively is preferable. In this case, by initially positioning the image plane of each projection optical unit PL1 to PL5 in the median of the range of possible changes in the focal point of each projection optical unit PL1 to PL5, a scanning exposure process can be repeatedly performed while not being adversely influenced by the change in the focal point of each projection optical unit PL1 to PL5.

In addition to this, according to the above-mentioned second embodiment, the present invention is explained while placing a special emphasis on changes in the focal point of each projection optical unit PL1 to PL5; however, the present invention may be also used for changes in the other optical characteristics (aberration, magnification, image shift, image rotation, etc.) due to optical absorption in lenses. For example, the present invention is also effective in suppressing (controlling) changes in the optical characteristics including changes in the focal point of each projection optical unit PL1 to PL5 the case of not providing the lens near the pupil plane of each projection optical unit PL1 to PL5.

An optical intensity distribution with the peripheral portion of the secondary light source having a substantially higher intensity than that of the center portion of the secondary light source is now described. FIGS. 21A to 21I are graphs showing the distributions of optical intensity of the secondary light source. The vertical axes show the respective optical intensities. The horizontal axes show each location ranging from the central position to the peripheral portion. A point of intersection 0 of each horizontal axis and corresponding vertical axis is the central position of the secondary light source. The peripheral portion is located towards the leaving direction from the central position along the horizontal axis. The center portion may be the central position, the central position and its vicinity, or the vicinity of the central position. The peripheral portion may be the area located in the surrounding area of the center portion.

Figure 21A:
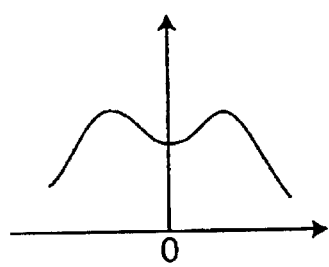
FIGS. 21A to 21I are graphs for showing the optical intensity distribution of the secondary light source of the second embodiment.
Figure 21B:
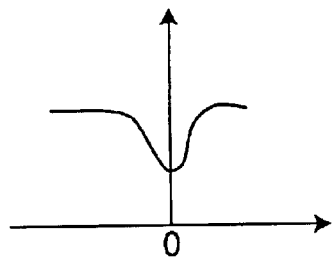
Figure 21C:
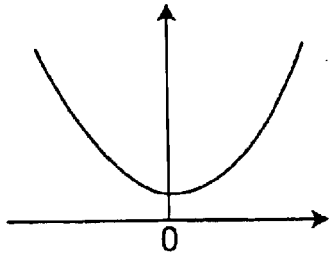
Figure 21D:
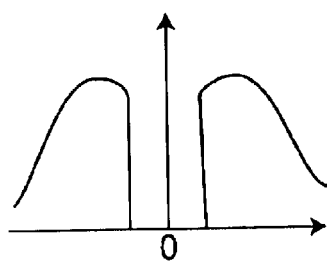
Figure 21E:
Figure 21F:
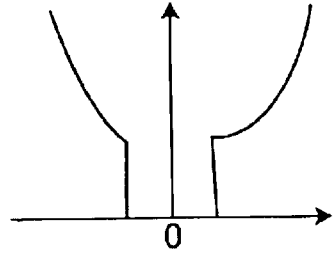

An example of a pattern of optical intensity at the center portion has (1) a decreasing optical intensity on the center portion towards the central position, (2) an optical intensity of 0 on the center portion, or (3) an optical intensity of a fixed value except for 0 on the center portion. FIGS. 21A, 21B, and 21C correspond to (1); FIGS. 21D, 21E, and 21F correspond to (2); and FIGS. 21G, 21H, and 21I correspond to (3).

Figure 21G:
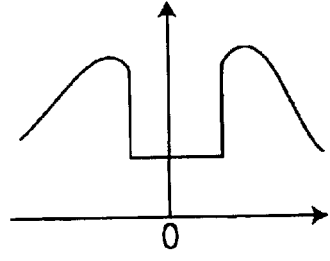
Figure 21H:
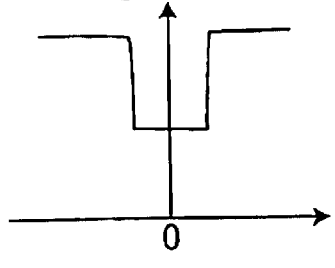
Figure 21I:
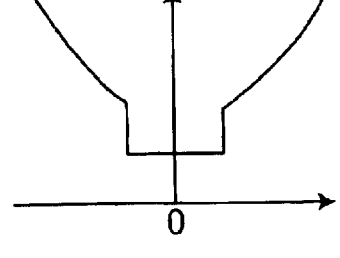

An example of optical intensity at the peripheral portion has (1) a decreasing optical intensity on the peripheral portion towards the distance from the central position, (2) a fixed optical intensity on the peripheral portion, or (3) an increasing optical intensity on the peripheral portion towards the distance from the central position. FIGS. 21A, 21D, and 21G correspond to (1); FIGS. 21B, 21E, and 21H correspond to (2); and FIGS. 21C, 21F, and 21I correspond to (3).

The distributions of optical intensity shown in FIGS. 21A to 21I may be formed by using, for example, conical prism 9 in FIG. 15, diffractive optic elements (DOE) 111$b$ to 111$f$ in FIG. 18, or split lenses 121, lens 123 in FIG. 19.

Figure 22A:
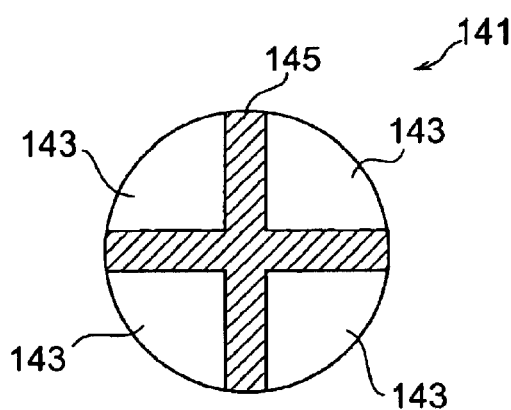
FIGS. 22A to 22D are top views of the diaphragms used in the second embodiment.
Figure 22B:
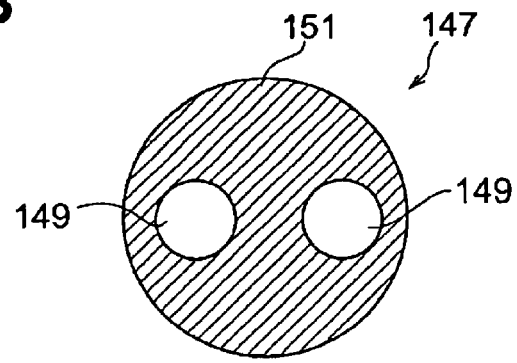
Figure 22C:
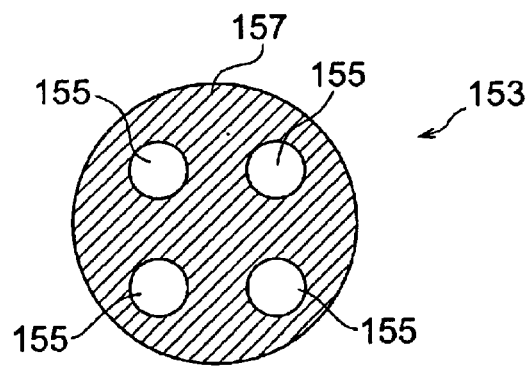
Figure 22D:
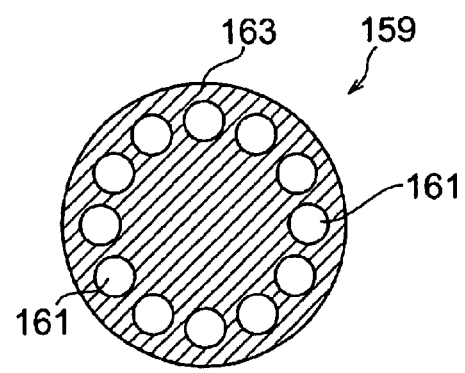

A optical intensity distribution where the peripheral portion of the secondary light source has a substantially higher intensity than that of the center portion of the secondary light source may be alternatively formed by using, for example, stops 141, 147, 153, or 159 in FIGS. 22A to 22D, respectively. These stops are used in place of annular aperture stop 101$b$ as shown in FIG. 17. Stop 141 in FIG. 22A is comprised of cross-shaped shade 145, which extends from the center portion of the stop to the peripheral portion of the stop, and four fan-shaped apertures 143 shade 145, which are positioned around shade 145. According to stop 141, the secondary light source is a cross shape. Stop 147 in FIG. 22B is comprised of two circular apertures 149, which are positioned in the peripheral portion of the stop, and shade 151, which is positioned in the peripheral portion of the stop except for the center portion of the stop and the area of aperture 149. According to stop 147, the secondary light source has two poles. Stop 153 in FIG. 22C is comprised of four circular apertures, which are positioned in the peripheral portion of the stop, and shade 157, which is positioned in the peripheral portion of the stop except for the center portion of the stop and the area of aperture 155. According to stop 153, the secondary light source has four poles. Stop 159 in FIG. 22D is comprised of more than four circular apertures 161, which are positioned in the peripheral portion, and shade 163, which is positioned in the peripheral portion of the stop except for the center portion of the stop and the area of apertures 161. These apertures 161 are positioned in a circular shape. According to stop 159, the secondary light source has more than four multiple poles.

Incidentally, it is preferable that the optical intensity distribution of the secondary light source to a desired pattern so that the intensity distribution setting unit (e.g., a conical prism or a diffractive optic element) can control the change amount in the position of the image plane of each projection optical unit in the focusing direction, to be less than the focal depth of each projection optical unit. More specifically, considering the possible influence of the flatness level of the substrate, it is preferable that the intensity distribution setting unit (e.g., a conical prism or a diffractive optic element) controls it to be less than half the focal depth of each projection optical unit. In this case, if the numerical aperture NA of each projection optical unit is 0.1 and the exposure wavelength λ is 400 nm, for example, then focal depth DOF (=λ/(NA2)) of each projection optical unit is 40 $\mu$m. In this case, assuming that corrugate amount ΔP indicating the flatness level (AF control residue) of a general substrate be 10 $\mu$m, corrugate amount ΔS indicating the flatness level (AF control residue) of a substrate stage (a holder) holding the substrate be 5 $\mu$m, and aberration ΔA of each projection optical unit (including each module difference) be 5 $\mu$m, then allowable focusing amount Fa (=DOF−ΔP−ΔS−ΔA) is equal to 20 $\mu$m. Accordingly, in this example, it is preferable that it be controlled to be less than 20 $\mu$m (half the focal depth of each projection optical unit).

Figure 23:
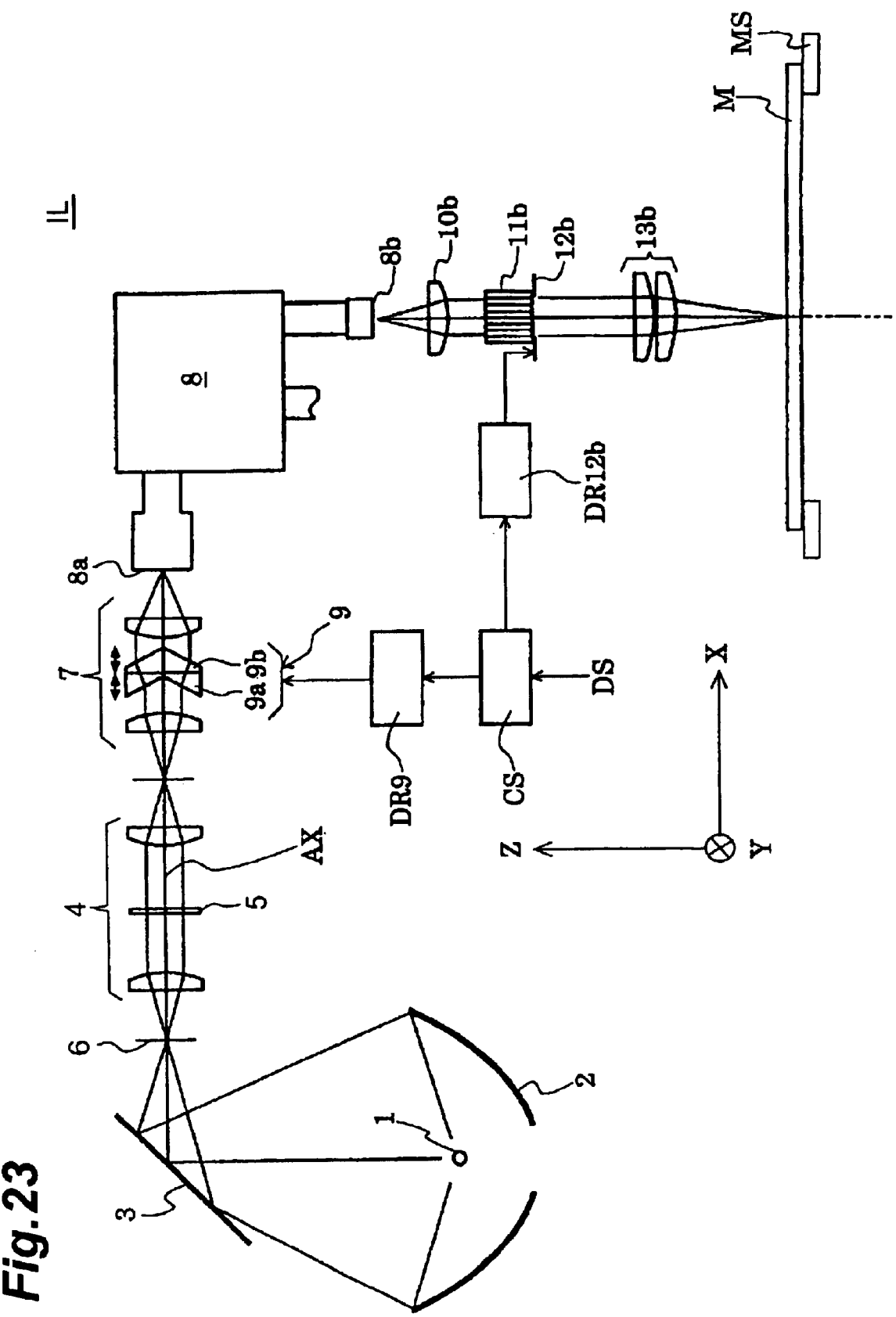
FIG. 23 is a diagram for schematically illustrating the structure of the substantial part of the fifth alternative example of the second embodiment.

The fifth alternative example of the second embodiment shown in FIG. 15 is now explained while referencing FIG. 23. The example shown in FIG. 23 adjusts the intensity distribution of the secondary light source to be formed by each optical integrator (11b to 11f) in conformity with the change in the optical characteristics of each projection optical unit. What is different in FIG. 23 from the example shown in FIG. 15 is that variable axicon 9, variable aperture stop 12, measuring sensor DS (see FIG. 16), controller CS, and each drive device (DR9, and DR12b to DR12f) are provided.

As shown in FIG. 23, variable axicon 9 is comprised of concave conical prism 9a with a concave conical surface on the light source side, and convex conical prism 9b with a concave conical surface on the to-be-illuminated side, with this configuration, moving at least one of the prisms along the optical axis allows the diameter of the annular luminous flux to be variable (namely, allows the ratio of the internal diameter of the annular light to the outer diameter of the annular light, or the annular ratio, to be variable). Accordingly, the diameter (annular ratio) of the annular secondary light source configured with each of optical integrators (11b to 11f) is variable.

Furthermore, variable aperture stops (12b to 12f) change the annular aperture in conformity with the setting of the diameter of the annular luminous flux by above-mentioned variable axicon 9, namely the diameter (annular ratio) of the annular secondary light source configured with each of optical integrators (11b to 11f), exactly regulating the annular secondary light source. It is noted here that variable axicon 9 and variable aperture stops (12b to 12f) are driven (activated) by each drive device (DR9, and DR12b to DR12f).

Next, the operation of the example shown in FIG. 23 is now briefly explained. First, as shown in FIG. 16, the change with respect to the optical characteristics (focus, aberration, illuminance, telecentricity, etc.) is measured using measuring sensor DS positioned at one end of substrate stage PS for each projection measuring unit (measuring step). Next, controller CS calculates a luminous flux state which allows an adjustment (correction) of optical characteristics of each projection optical unit measured based upon the output of measuring sensor DS (calculation step). Based on this calculation result, variable axicon 9 and variable aperture stops (12b to 12f) in each illumination system are driven (become variable) through each drive device (DR9, and DR12b to DR12f) (an adjustment step or a correction step). Accordingly, since each projection optical unit with favorable optical characteristics allows for projection exposure of a pattern image of mask M on photosensitive substrate P, favorable mask pattern image can be formed on substrate P, a favorable microdevice may be fabricated.

It is noted here that, in order to change the optical intensity distribution of the secondary light source by relay lens system 7, which is configured with a variable power optical system, a lens of variable power optical lens system 7 may be moved by drive system DR9a. Furthermore, variable axicon 9 is not limited to the configuration that allows annular luminous flux to be variable, and may be a configuration that allows for a formation of multiple pole luminous fluxes. In this case, for example, the light source side of prism 9a shown in FIG. 23 may be configured with, multi-sided pyramidal concave surfaces, whereas the to be illuminated side of prism 9b may be configured with multi-sided pyramidal convex surfaces. By relatively changing the interval between two pyramidal prisms, the size of the multiple-pole shaped secondary light source configured with each optical integrator (11b to 11f) can be changed. It is noted here that, needless to say, fixed axicon 9 shown in FIG. 15 may also be an element comprising the multiple-pole shaped secondary light source; in this case, it is preferable for prism 9 to have a multiple-sided pyramidal refractive surface.

Figure 24:
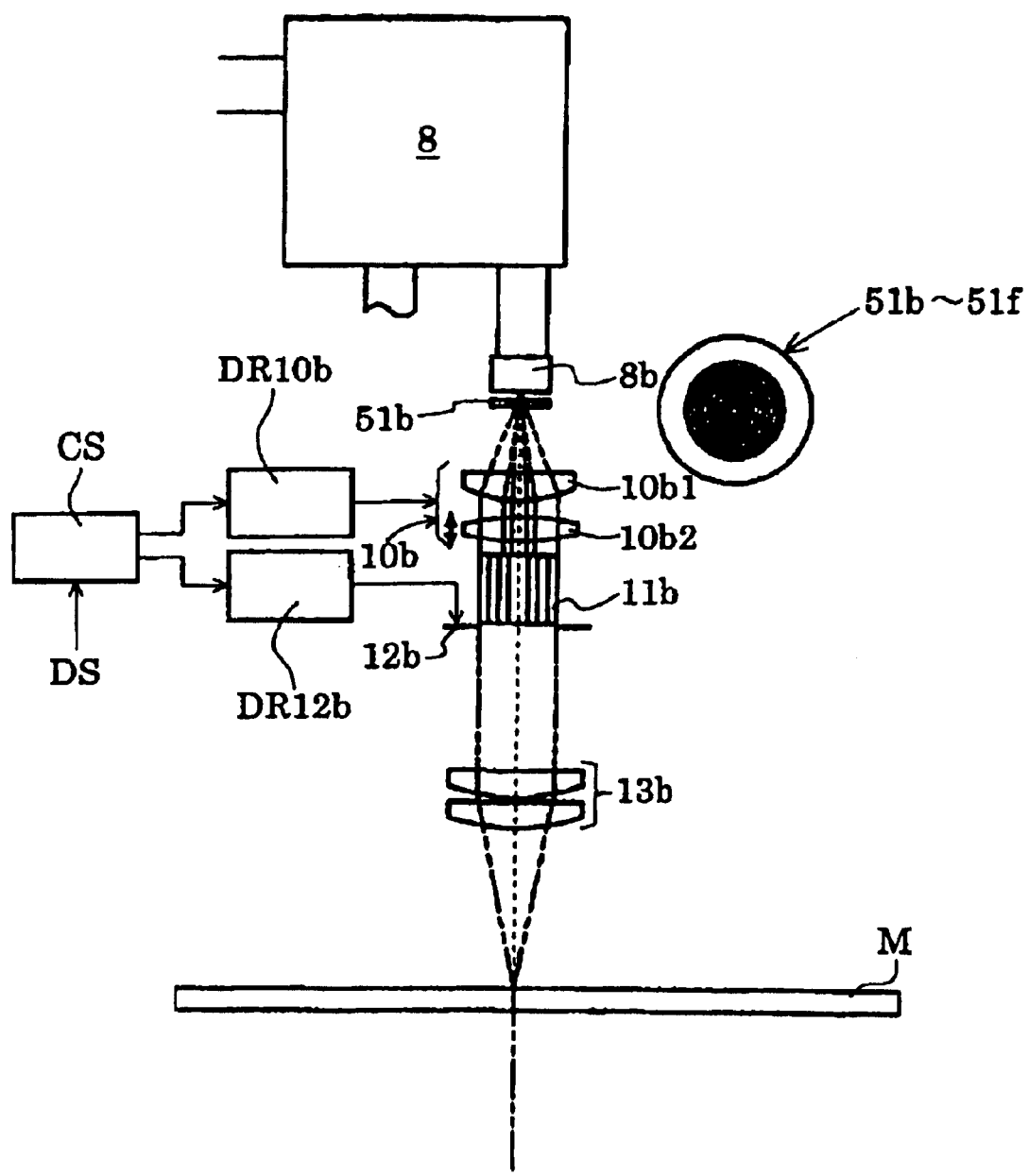
FIG. 24 is a diagram for schematically illustrating the structure of the substantial part of the sixth alternative example of the second embodiment.

Furthermore, the configuration that allows for an adjustment of the optical intensity distribution of the second light source configured with each optical integrator (11b to 11f) in accordance with the change of the optical characteristics of each projection optical unit is not limited to the example shown in FIG. 23, and can be alternatively provided by modifying a part of the configuration shown in FIG. 18. FIG. 24 shows the sixth alternative example of the second embodiment, which is now explained while referring FIG. 24. In FIG. 24, what is different from the example shown in FIG. 18 is that variable power optical system (variable power collimate system) 10b, variable aperture stop 12, measuring sensor DS (see FIG. 16), controller CS, and each drive device (DR10b, and DR12b to DR12f) are provided.

As shown in FIG. 24, variable power optical system 10b is comprised of at least two lenses (10b1 and 10b2). With this configuration, moving at least one of the lenses 10b2 along the optical axis allows the diameter of the annular luminous flux to be variable (namely, allows the ratio of internal diameter of the annular light to the outer diameter of the annular light, or an annular ratio to be variable). Accordingly, the diameter (annular ratio) of the annular secondary light source configured with each of optical integrators (11b to 11f) is variable.

Furthermore, variable aperture stops (12b to 12f) change the annular aperture in conformity with the setting of the diameter of the annular luminous flux by the above-mentioned variable power optical system 10b, namely the diameter (annular ratio) of the annular secondary light source configured with each of optical integrators (11b to 11f), exactly regulating the annular secondary light source. It is noted here that variable power optical system 10b and variable aperture stops (12b to 12f) are driven (moved) by each drive device (DR10b, and DR12b to DR12f).

Next, the operation of the example shown in FIG. 24 is now briefly explained. First, as shown in FIG. 16, the change with respect to the optical characteristics (focus, aberration, illuminance, telecentricity, etc.) is measured using measuring sensor DS as each projection measuring unit is positioned at one end of substrate stage PS (measuring step). Next, controller CS calculates a luminous flux state which allows an adjustment (correction) of the optical characteristics of each projection optical unit measured based upon the output of measuring sensor DS (calculation step). According to this calculation result, variable power optical system 10b and variable aperture stops (12b to 12f) in each illumination system are driven (become variable) through each drive device (DR10b, and DR12b to DR12f) (an adjustment step or a correction step). Accordingly, since each projection optical unit with favorable optical characteristics allows for projection exposure of a pattern image of mask onto photosensitive substrate P, favorable mask pattern image can be formed on substrate P, a favorable microdevice may be fabricated.

It is noted here that the example shown in FIG. 24 shows the case of using diffractive optical elements, which allow for the formation of an annular luminous flux (an annular distribution of optical flux); needless to say, diffractive optic elements, which allows for the formation of a circular luminous flux (a circular optical intensity distribution) may be alternatively used for it. In this case, it is preferable to adjust (correct) the diameter (size) of the circular secondary light source which is formed by each optical integrator (11b to 11f) so that the optical characteristics of each projection optical unit can be adjusted (corrected) through variable power optical system 10b. In this case, needless to say; it is preferable that σ value (numerical aperture of illumination system/numerical aperture of projection optical unit, or size (diameter) of the secondary light source in the pupil of the projection optical unit/size (diameter) of the pupil in the projection optical unit) be greater than 0.7. As described above, a fixed or a variable axicon (a conical prism, a pyramidal prism, etc.), a diffractive optic elements (DOE), a fixed or variable annular aperture stop, and other related elements comprise the elements which forms a optical intensity distribution that has strong intensity the peripheral portion.

Figure 25:
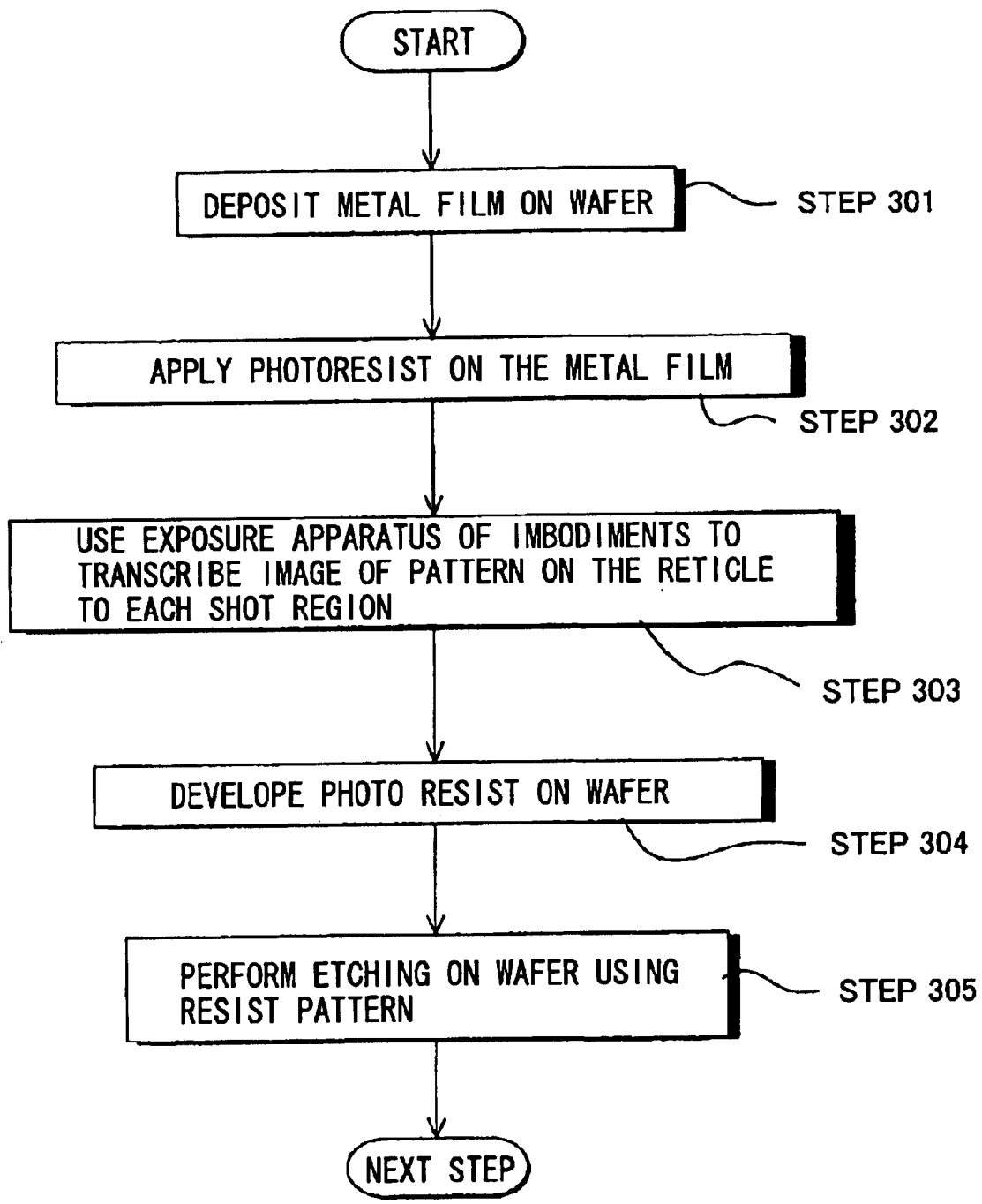
FIG. 25 is a flowchart of the process for obtaining a microdevice such as a semiconductor device through the formation of a predetermined circuit pattern on a photosensitive substrate such as a wafer using an exposure apparatus of this embodiment.

An exposure apparatus according to this embodiment may be fabricated by electrically, mechanically, optically coupling each optical element, each stage and related members of this embodiment shown in FIGS. 2 and 14 so that the above-mentioned functions can be implemented. With this configuration, microdevices (semiconductor devices, LCD devices, thin-film magnetic heads, etc.) can be fabricated by illuminating the mask by illumination system IL (an illumination step), and then performing a scanning exposure of a transcription pattern formed on the mask onto the photosensitive substrate using projection optical system PL made up of projection optical units PL1 to PL5. In the following, an example of a procedure for providing a semiconductor device, which is a microdevice, by forming a certain circuit pattern on a wafer, which is a photosensitive substrate, or related bases utilizing an exposure apparatus according to the first and second embodiments, will be explained while referencing a flowchart in FIG. 25.

First, in step 301, a metal film is deposited on top of one lot of wafers. In the next step 302, a photoresist is applied to the surface of the metal films on the wafers. Afterwards, in step 303, an image for the pattern on the mask is transferred to each shot region on the lot of wafers through the projection optical system (projection optical unit) utilizing the exposure apparatus shown in FIGS. 2 and 14. Afterwards, in step 304, the photoresist on the lot of wafers is developed; and then in step 305, by etching with the photoresist pattern on the lot of wafers as a mask, a circuit pattern corresponding to the pattern on the mask is formed in each shot region on each wafer. Thereafter, by further processing such as forming upper layer's circuit patterns, a device such as a semiconductor device is fabricated. According to the semiconductor device fabrication method as described above, semiconductor devices with a microscopic circuit pattern can be provided with a high throughput.

Figure 26:
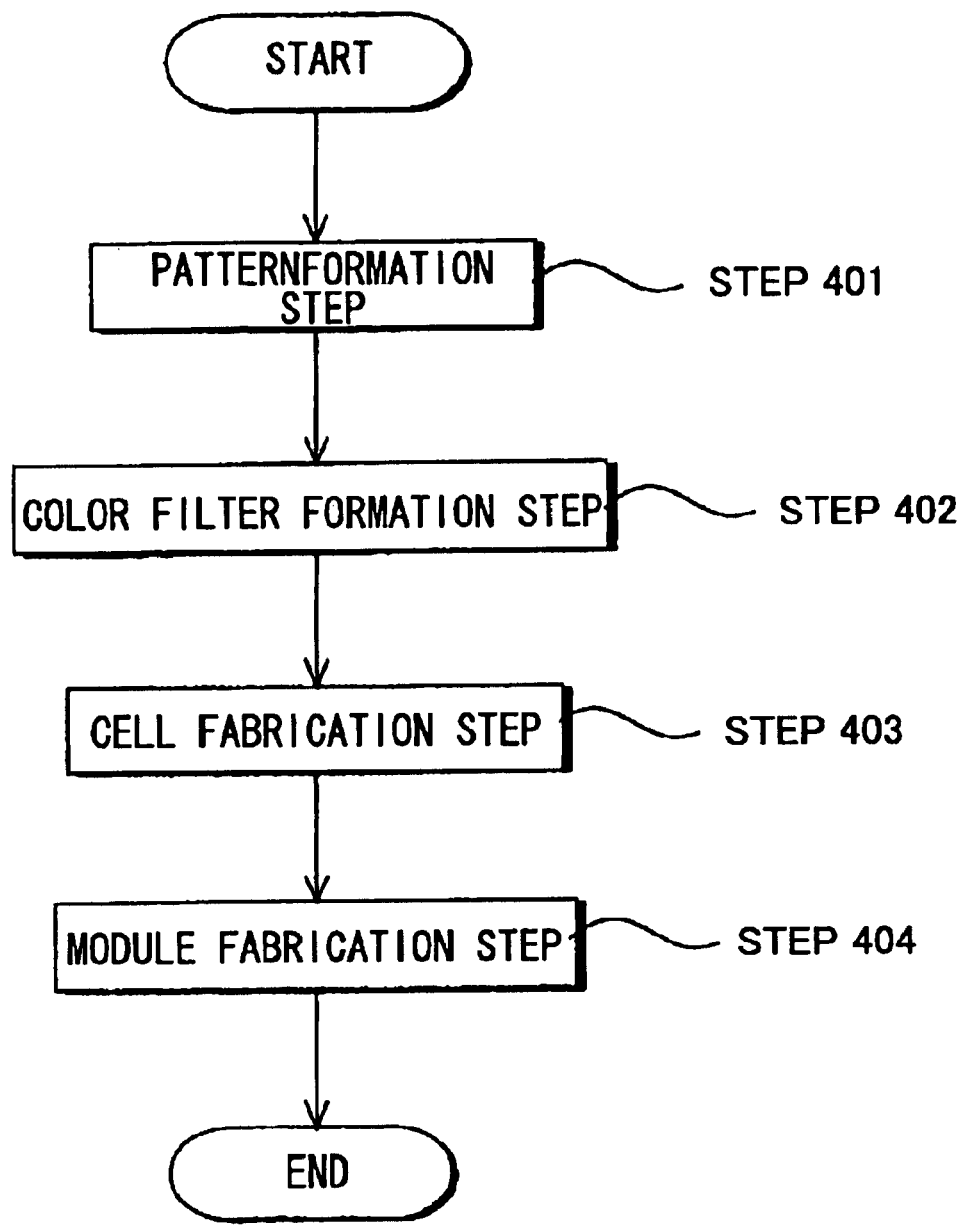
FIG. 26 is a flowchart of the process for obtaining a microdevice such as a liquid crystal display device through the formation of a predetermined circuit pattern on a substrate using an exposure apparatus of this embodiment.

Furthermore, according to the exposure apparatus shown in FIGS. 2 and 14, LCD devices, which are a microdevice, may be also provided by forming given patterns (a circuit pattern, an electrode pattern, and related patterns) on the substrate (glass substrate). In the following, an example of a procedure for this is explained while referencing FIG. 26. In pattern formation step 401 of FIG. 26, a photolithographic process for transferring a mask pattern and exposing it on a photosensitive substrate (a glass substrate to which a photoresist is applied), which utilizes the exposure apparatus of this embodiment, is performed. Through this photolithographic process, a predetermined pattern including multiple electrodes or related elements is formed on the photosensitive substrate. Afterwards, the exposed substrate goes through a development step, a etching step, a photoresist removing step and related steps so that a predetermined pattern is formed on the substrate, then going to the next color-filter formation step 402.

Next, in color-filter formation step 402, lots of three dot sets corresponding to R (Red), G (Green), and B (Blue) are arrayed in a matrix, or multiple sets of three filtering stripes of R, G, and B are arranged along the horizontal scanning line, forming a color filter. After color filter formation step 402, cell fabrication step 403 is executed. In cell fabrication step 403, a LCD panel (LCD cells) is fabricated using the substrate with a predetermined pattern provided in pattern formation step 401, the color filter provided in color filter formation step 402, and related members. In cell fabrication step 403, liquid crystal is poured between the substrate with a predetermined pattern provided in pattern formation step 401 and the color filter provided in color filter formation step 402 so that the LCD panel (LCD cells) is manufactured.

Afterwards, in module fabrication step 404, each part such as an electric circuit, which allows the fabricated LCD panel (LCD cells) to display, and a backlight are fixed so as to complete an LCD device. According to the manufacturing method of the LCD device as described above, it is possible to provide an LCD device having a very microscopic circuit pattern in a high throughput.

It is noted here that according to the above-mentioned first and second embodiments, the present invention is used for multi-scanning projection exposure apparatus with each projection optical unit having a pair of image forming optical systems; however, it is also possible to alternatively use the present invention for such a multi-scanning projection exposure apparatus as each projection optical unit includes more than one or more than three image forming optical systems.

Furthermore, according to the first and second embodiments as described above, the present invention is used for the multi-scanning projection exposure apparatus with each projection optical unit having a catadioptric type image forming optical system; however, the present invention is not limited to this, and can be used for the multi-scanning projection exposure apparatus with, for example, refraction-type image forming optical system.

Furthermore, according to the first and second embodiments as mentioned above, a extra-high pressure mercury vapor lamp is used as a light source; however, they are not limited to this, and the other suitable light sources may be alternatively used for it. In other words, the exposure wavelengths, according to the present invention, are not particularly limited to g-rays, h-rays, and i-rays.

Furthermore, according to the aforementioned first and second embodiments of the present invention, the multi-scanning projection exposure apparatus with the projection optical system made up of multiple projection optical units is explained. However, the present invention is also effective in the case where in a conventional exposure apparatus, the change in the optical characteristics including, for example, the change in the focal point of the projection optical system is measured, and based upon the results of the measurement the optical intensity distribution of the secondary light source is then adjusted.

Furthermore, in the second embodiment described above, while the optical intensity distribution at the pupil plane of the illumination optical system is made so that it is higher the peripheral portion than at the center portion, for example an annular-shaped intensity distribution, a certain portion of each respective exposed exposure region, which is formed on substrate P by each projection optical module (PL1 to PL5), is exposed in an overlapping manner. As a result, with overlapping exposure performed like that shown in the second embodiment, it is possible to achieve the results of super-resolution techniques, wherein exposure is performed with the projection optical modules PL1 to PL5 achieving higher resolution than the originally achieved resolution and the projection optical modules PL1 to PL5 having deeper focal depth than the original focal depth.

From this view point, on the occasion of performing projection exposure of an image pattern of a mask (or reticle) onto a substrate (a wafer, etc.) using a single projection optical system that is provided in a step-and-repeat exposure apparatus or a step-and-scan exposure apparatus, by combining continuous exposure (partially overlapping exposure) and the above-mentioned super-resolution techniques, it is possible to expect even larger results, for example even when fabricating semiconductor devices.

It is noted here that the above-mentioned step-and-repeat exposure apparatus repeatedly performs the processes of projection exposing a certain shot region on the substrate (wafer, etc.) with an image pattern of a mask (or reticle) using a single projection optical system while in the state of temporarily stopping the mask (or reticle) and the substrate (wafer, etc.), then moving (stepping) the substrate to another shot region on the substrate to again expose that other shot region. Furthermore, the step-and-scan exposure apparatus repeatedly performs the processes of scan exposing an image pattern of a mask (or reticle) onto a substrate (wafer, etc.) using a single projection optical system while moving the mask (or reticle) and the substrate (wafer, etc) in the scanning direction, then moving (stepping) the substrate to another shot region on the substrate to again perform scanning exposure of that other shot region.

In the above manner, the combination of continuous exposure (partially overlapping exposure) and the above-mentioned super-resolution techniques may also be included within the technical scope of the present invention.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A microdevice manufacturing method, comprising:
   an exposure step of using an exposure apparatus, comprising: an illumination optical system, which illuminates a mask with a predetermined pattern; a projection optical system, which includes a plurality of projection optical modules arrayed in a predetermined direction in order to form partially overlapping exposure regions on a photosensitive substrate, and projects the pattern of said mask onto said photosensitive substrate; and, a focusing adjustment unit, which aligns each respective image plane of said plurality of projection optical modules with respect to said photosensitive substrate in a certain focusing direction; wherein said focusing adjustment unit sets at a substantially same position in said certain focusing direction, certain portions that contribute to formation of said partially overlapping exposure regions on image planes of projection optical modules that are next to each other, to expose a pattern of said mask to said photosensitive substrate;
   a developing step of developing said substrate that is exposed; and
   an adjusting step of detecting a change amount of an image positioned in said partially overlapping exposure regions projected by said projection optical modules, in said certain focusing direction, by said exposure step to adjust said focusing adjusting units respectively provided in said projection optical modules to align the image planes of said projection optical modules in said certain focusing direction.

2. An exposure apparatus manufacturing method, which exposes a pattern of a mask onto a photosensitive substrate using a projection optical system having a plurality of projection optical modules arrayed in a predetermined direction in order to form partially overlapping exposure regions on said photosensitive substrate, and an illumination optical system that illuminates said mask with a predetermined pattern; said exposure apparatus manufacturing method comprising:
   a setting step of setting focus adjusting means in said projection optical modules, said focus adjusting means moving images projected by said projection optical modules in a certain focusing direction;
   a measurement step of measuring position of image planes of said plurality of projection optical modules in said certain focusing direction; and
   an adjustment step of adjusting so that portions that contribute to said partially overlapping exposure regions of image planes of projection optical modules that are next to each other have substantially the same position in said certain focusing direction by said focus adjusting means, by using measurement information that is obtained in said measurement step.

3. An exposure apparatus manufacturing method, which exposes a pattern of a mask onto a photosensitive substrate using a projection optical system that has a plurality of projection optical modules arrayed in a predetermined direction and an illumination optical system that illuminates said mask with a predetermined pattern;
   said exposure apparatus manufacturing method comprising:
   a calculation step of pre-calculating a maximum positional change amount for image plane of every said plurality of projection optical modules in a certain focusing direction, which are caused by exposure to said photosensitive substrate; and
   a setting step of setting initial reference image planes of said plurality of projection optical modules based on calculated results of said calculation step.

4. The exposure apparatus manufacturing method according to claim 3, wherein said setting step further comprises an adjustment step of adjusting such that portions that contribute to formation of partially overlapping exposure region in image plane of projection modules that are next to each other have a nearly same position in said certain focusing position.

5. A micro-device manufacturing method, comprising:
   an exposure step of using an exposure apparatus comprising: an illumination system for illuminating each of respective plurality of regions in a predetermined direction, said regions are included in a pattern formed on a mask; and a projection optical system, which comprises a plurality of projection optical units arrayed corresponding to said plurality of regions on a mask, and projects the pattern that is formed on said mask to a photosensitive substrate; wherein said illumination system forms a secondary light source at a position substantially optically conjugate with each respective pupil plane on said plurality of projection optical units, and has a function for introducing said light from said secondary light source into said mask, and said illumination system comprises, in order to actually control changes in each respective optical characteristic of said plurality of projection optical units by optical illumination, a setting unit that sets said secondary light source for an optical intensity distribution that is actually higher intensity in the peripheral portion therein than in a center portion therein, to set said secondary light source for an optical intensity distribution that is actually higher intensity in a peripheral portion therein than in the center portion therein so as to suppress changes in each respective optical characteristic of said plurality of projection optical units, and expose said pattern image of said mask onto said photosensitive substrate; and a development step of developing said substrate exposed.

6. An exposure method, which illuminates a plurality of regions, which are positioned in a given direction on a mask with a pattern, and then projection exposes said pattern formed on said mask onto a photosensitive substrate through a projection optical system with a plurality of projection optical units positioned corresponding to said plurality of regions on said mask; said exposure method comprising:

an illumination step of illuminating a plurality of regions on said mask by forming a secondary light source in a position nearly optically conjugate with the pupil plane of each of said plurality of projection optical units, and then guiding light from said secondary light source to said mask; and a setting step of setting the optical intensity distribution of said secondary light source where its peripheral portion has a practically higher intensity than that of its center portion, as to suppress the change in the optical characteristics of each of said plurality of projection optical units.

7. The exposure method according to claim 6, further comprising:

an additional setting step of setting the outer diameter of said secondary light source when it is converted to a value on said pupil plane, to greater than a given ratio times the clear aperture of said pupil plane.

8. The exposure method according to claim 6, further comprising:

an exposure step of moving in a scanning direction on that crosses said given direction said mask and said photosensitive substrate against said projection optical system, and then scan exposing said pattern formed on said mask onto said photosensitive substrate via said projection optical system.

9. An exposure method according to claim 6, wherein said projection optical unit comprises a catadioptric optical system.

10. An exposure method, which illuminates a plurality of regions, which are positioned in a given direction on a mask, on which a pattern to be transferred is formed, and then projection exposes said pattern formed on said mask onto a photosensitive substrate through a projection optical system with a plurality of projection optical units positioned corresponding to said plurality of regions on said mask; said exposure method comprising:

an illumination step of illuminating a plurality of regions on said mask by forming a secondary light source in a position nearly optically conjugate with the pupil plane of each of said plurality of projection optical units, and then guiding light from said secondary light source to said mask; and a setting step of setting the outer diameter of said secondary light source when it is converted to a value on said pupil plane, to greater than 0.7 times the clear aperture of said pupil so that change in the optical characteristics of each of said plurality of projection optical units, which is caused by irradiation of light, can be practically suppressed.

11. The exposure method according to claim 10, further comprising:

an exposure step of moving in a scanning direction on that crosses said given direction said mask and said photosensitive substrate against said projection optical system, and then scan exposing said pattern formed on said mask onto said photosensitive substrate via said projection optical system.

12. An exposure method according to claim 10, wherein said projection optical unit comprises a catadioptric optical system.

13. An exposure method comprising:

an illumination step of illuminating a mask using an illumination optical system; and a transcription step of transcribing a pattern that is formed on said mask onto a photosensitive substrate;

wherein:

said illumination step includes a step of making an optical intensity distribution at pupil of said illumination optical system higher at a peripheral portion than at a center portion; and said transcription step comprising:

a first exposure step, which forms a first exposure region on said photosensitive substrate while making said optical intensity distribution at pupil of said illumination optical system higher at said peripheral portion than at said center portion with practically suppressing change in optical characteristics of each of a plurality of projection optical units, which is caused by irradiation of light; and a second exposure step, which forms on said photosensitive substrate a second exposure region that partially overlaps said first exposure region while making said optical intensity distribution at pupil of said illumination optical system higher at said peripheral portion than at said center portion with practically suppressing change in the optical characteristics of each of said plurality of projection optical units, which is caused by irradiation of light.

14. The exposure method according to claim 13, wherein said transcription step comprises a step of projecting the pattern of said mask onto said photosensitive substrate using a projection optical system.

15. The exposure method according to claim 14, further comprising:

a scanning step of moving said mask and said photosensitive substrate relative to said projection optical system.

16. The exposure method according to claim 15, wherein:

said first exposure step comprises a step of forming a first exposure region on said photosensitive substrate while moving said mask and said photosensitive substrate relative to said projection optical system in said scanning step; and said second exposure step comprises a step of forming a second exposure region on said photosensitive substrate while moving said mask and said photosensitive substrate relative to said projection optical system in said scanning step.

17. A microdevice manufacturing method, comprising:

an exposure step of using an exposure apparatus comprising: an illumination optical system, which illuminates a mask with a predetermined pattern; a projection optical system, which includes a plurality of projection optical modules that are arrayed in a predetermined direction, and projects the pattern of said mask onto a photosensitive substrate; a first adjusting unit, which compensates a change of a first optical characteristic in accordance with time passage with respect to at least one projection optical module of said plurality of projection optical modules; and a second adjusting unit, which compensates a second optical characteristic that differs from said first optical characteristic and is caused by said first adjusting unit, to expose a pattern of said mask;

a developing step of developing said substrate that is exposed; and an adjusting step of, by performing said exposure step, performing adjustment, using said first adjusting unit which compensates change of a first optical characteristic in accordance with time passage with respect to at least one projection optical module of said plurality of projection optical modules, and said second adjusting unit.

18. A microdevice manufacturing method, comprising:

an exposure step of using an exposure apparatus comprising: an illumination optical system, which illuminates a mask with a predetermined pattern; a projection optical system, which includes a plurality of projection optical modules arrayed in a predetermined direction, and projects the pattern of said mask onto a photosensitive substrate; a first adjusting unit, which compensates a chance of an optical characteristic with respect to at least one of said plurality of projection optical modules that develop due to heat deformation of at least one optical component that is included in each of respective said plurality of projection optical modules; and a second adjusting unit, which compensates a change of an optical characteristic with respect to said plurality of projection optical modules that develop due to heat deformation of at least one deflecting member included in each of respective said plurality of projection modules to expose a pattern of said mask to said photosensitive substrate;

a developing step of developing said substrate that is exposed; and an adjusting step of performing adjustment by performing said exposure step, using said first adjusting unit which compensate the change of a first optical characteristic that develops due to heat deformation of at least one optical component that is included in each of respective said plurality of projection optical modules or said second adjusting unit.

19. A microdevice manufacturing method, comprising:

an exposure step of using an exposure apparatus, comprising: an illumination optical system, which illuminates a mask with a predetermined pattern; and a projection optical system, which comprises a plurality of projection optical modules that are irradiated with light from said illumination optical system through said mask and arrayed in a predetermined direction, and projects the pattern of said mask onto a photosensitive substrate; wherein, in order to form a partially overlapping exposure region onto said photosensitive substrate, image planes of said plurality of projection optical modules have a portion that contributes to the formation of said overlapping exposure regions; and moreover, in order to make position of portions that contribute to formation of said overlapping exposure regions that are next to each other substantially the same in a certain focusing direction, further comprising a focus adjustment unit that performs adjustment of position in said certain focusing direction of image plane of each of said plurality of projection optical modules, to expose a pattern of said mask to said photosensitive substrate;

a developing step of developing said substrate that is exposed; and an adjusting step of detecting change amount of an image positioned in said overlapping exposure regions projected by said projection optical modules, in said certain focusing direction, by said exposure step to adjust said focusing adjusting units respectively provided in said projection optical modules to align the image planes of said projection optical modules in said certain focusing direction.

20. A microdevice manufacturing method, comprising:

an exposure step of using an exposure apparatus, comprising: an illumination system for illuminating each of respective plurality of regions in a predetermined direction, said regions are included in a pattern formed on a mask; and a projection optical system, which comprises a plurality of projection optical units arrayed corresponding to said plurality of regions on a mask, and projects the pattern that is formed on said mask to a photosensitive substrate; wherein said illumination system forms a secondary light source at a position substantially optically conjugate with each respective pupil plane on said plurality of projection optical units, and has a function for introducing said light from said secondary light source into said mask; and said illumination system comprises, in order to actually control changes in each respective optical characteristic of said plurality of projection optical units by optical illumination, a setting unit that sets said secondary light source for an optical intensity distribution that is actually higher intensity at a peripheral portion therein than in center portion therein, to set said secondary light source for an optical intensity distribution that is actually higher intensity at the peripheral portion therein than in center portion therein so as to suppress changes in each respective optical characteristic of said plurality of projection optical units, and expose said pattern image of said mask onto said photosensitive substrate; and a developing step of developing said substrate that is exposed.

21. A microdevice manufacturing method, comprising:

an exposure step of using an exposure apparatus, comprising: an exposure step of using an exposure apparatus, comprising: an illumination system, which illuminates each of a plurality of regions positioned in a given direction on a mask with a pattern, and a projection optical system, which has a plurality of projection optical units positioned corresponding to said plurality of regions on said mask, and which projects said pattern formed on said mask onto a photosensitive substrate; wherein: said illumination system has a function to form a secondary light source in a position substantially optically conjugate with the pupil plane of each of said plurality of projection optical units, and to guide light from said secondary light source to said mask; and said illumination system comprises a setting unit, which sets the outer diameter of said secondary light source when it is converted to a value on said pupil plane, to greater than 0.7 times the clear aperture of said pupil plane, so that a change in the optical characteristics of each of said plurality of projection optical units, which is caused by irradiation of light, can be controlled for the most part, to set the outer diameter of said secondary light source when it is converted to a value on said pupil plane, to greater than 0.7 times the clear aperture of said pupil plane, so as to suppress the change in the optical characteristics of each of said plurality of projection optical units and expose a pattern of said mask to said photosensitive substrate; and a developing step of developing said substrate that is exposed.

22. A microdevice manufacturing method, comprising: an exposure step of using an exposure apparatus, comprising: an illumination system, which illuminates a mask with a pattern; and a projection optical system, which projects said pattern on said mask onto a photosensitive substrate, wherein: said illumination system comprises: a formation unit, which forms a secondary light source in a position substantially conjugate with the pupil plane of said projection optical system, and an adjustment unit, which adjusts the optical intensity distribution of said secondary light source dependent upon a change in the optical characteristics of said projection optical system, to adjust the optical intensity distribution of said secondary light source, so as to suppress the change in the optical characteristics of said projection optical system and to expose a pattern of said mask to said photosensitive substrate; and a developing step of developing said substrate that is exposed.

23. A microdevice manufacturing method, comprising:

an exposure step of using an exposure apparatus, which exposes a photosensitive substrate through a mask on which a pattern to be transferred is formed on a plurality of regions in a given direction; said exposure apparatus comprising: a projection optical system, which has a plurality of projection optical units respectively positioned corresponding to said plurality of regions, and which projects said pattern onto a photosensitive substrate; and an illumination system, which forms a secondary light source in a position substantially optically conjugate with the pupil plane of each of said plurality of projection optical units, and which illuminates said mask with light from said secondary light source; wherein said illumination system, includes a setting unit, which sets an optical intensity distribution where a peripheral portion of said secondary light source has a higher intensity than that of a center portion, so that change in the optical characteristics of each of said plurality of projection optical units, which is caused by light from the secondary light source, can be controlled, to set an optical intensity distribution where a peripheral portion of said secondary light source has a higher intensity than that of a center portion so as to suppress the chance in the optical characteristics of each of said plurality of projection optical units and expose a pattern of said mask to said photosensitive substrate; and a developing step of developing said substrate that is exposed.

* * * * *